(12) United States Patent
Watanabe

(10) Patent No.: US 10,110,192 B2
(45) Date of Patent: Oct. 23, 2018

(54) ELECTRONIC COMPONENT

(71) Applicant: Murata Manufacturing Co., Ltd., Nagaokakyo-shi, Kyoto-fu (JP)

(72) Inventor: Kunihiro Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 212 days.

(21) Appl. No.: 14/955,138

(22) Filed: Dec. 1, 2015

(65) Prior Publication Data
US 2016/0156324 A1 Jun. 2, 2016

(30) Foreign Application Priority Data
Dec. 2, 2014 (JP) .................................. 2014-243625

(51) Int. Cl.
*H03H 7/01* (2006.01)
*H03H 1/00* (2006.01)

(52) U.S. Cl.
CPC ........ *H03H 7/0115* (2013.01); *H03H 7/1758* (2013.01); *H03H 7/1775* (2013.01); *H03H 2001/0085* (2013.01)

(58) Field of Classification Search
CPC ........... H03H 2001/0085; H03H 7/175; H03H 7/1758; H03H 7/0115; H03H 7/1775
(Continued)

(56) References Cited

U.S. PATENT DOCUMENTS

2006/0145782 A1 7/2006 Liu et al.
2009/0033439 A1\* 2/2009 Igarashi ............. H01P 1/20345
333/185
(Continued)

FOREIGN PATENT DOCUMENTS

CN 103138708 A 6/2013
EP 2 009 787 A1 12/2008
(Continued)

OTHER PUBLICATIONS

Official Communication issued in corresponding Japanese Patent Application No. 2014-243625, dated May 16, 2017.
(Continued)

*Primary Examiner* — Rakesh B Patel
(74) *Attorney, Agent, or Firm* — Keating & Bennett, LLP

(57) ABSTRACT

An electronic component includes a multilayer body and a first resonator. The multilayer body includes insulating layers stacked on each other in a stacking direction. The first resonator includes a first inductor and a first capacitor disposed in the multilayer body. The first inductor is defined by a conductive layer disposed on an insulating layer of the plurality of insulating layers and an interlayer connecting conductor which passes through an insulating layer of the plurality of insulating layers in the stacking direction connected to each other so that the first inductor preferably has a helical or substantially helical shape as viewed from a first direction perpendicular or substantially perpendicular to the stacking direction. A certain portion of the first inductor is located on a predetermined plane perpendicular or substantially perpendicular to the first direction, and a remaining portion of the first inductor is displaced from the predetermined plane in the first direction.

20 Claims, 22 Drawing Sheets

(58) Field of Classification Search
USPC .................................................. 333/175, 185
See application file for complete search history.

(56) References Cited

U.S. PATENT DOCUMENTS

| | | | |
|---|---|---|---|
| 2010/0007437 A1* | 1/2010 | Taniguchi | ................ H03H 7/09 333/175 |
| 2010/0171568 A1 | 7/2010 | Taniguchi | |
| 2013/0154768 A1 | 6/2013 | Taniguchi | |
| 2013/0241672 A1 | 9/2013 | Tamaru et al. | |
| 2016/0233844 A1* | 8/2016 | Masuda | .................. H01F 17/00 |

FOREIGN PATENT DOCUMENTS

| | | |
|---|---|---|
| JP | 10-065476 A | 3/1998 |
| JP | 2002-026677 A | 1/2002 |
| JP | 2005-039187 A | 2/2005 |
| JP | 2006-066769 A | 3/2006 |
| JP | 2008-527808 A | 7/2008 |
| JP | 2010-183513 A | 8/2010 |
| JP | 2010-205750 A | 9/2010 |
| WO | 2007/119356 A1 | 10/2007 |

OTHER PUBLICATIONS

Official Communication issued in Japanese Patent Application No. 2014-243625, dated Dec. 19, 2017.

* cited by examiner

10a~10d

ELECTRONIC COMPONENT

BACKGROUND OF THE INVENTION

1. Field of the Invention

The present invention relates to an electronic component, and more particularly, to an electronic component including resonators including inductors and capacitors.

2. Description of the Related Art

As electronic components of the related art, a multilayer band pass filter disclosed in International Publication No. 2007/119356, for example, is known. This multilayer band pass filter includes a plurality of LC parallel resonators. Each LC parallel resonator includes an inductor constituted by via-electrodes and inductor electrodes connected to each other. The inductor is formed substantially in a rectangular shape as viewed from a direction perpendicular or substantially perpendicular to a stacking direction of dielectric layers forming the multilayer band pass filter.

In the multilayer band pass filter disclosed in the above-described publication, it is desirable to obtain a greater inductance value. In order to satisfy this demand, the inductors may be formed substantially in a helical shape.

However, if the inductors are formed substantially in a helical shape, an inward inductor electrode and an outward inductor electrode adjacent to each other face each other. In this case, a large parasitic capacitance occurs between these inward and outward adjacent inductor electrodes. It is thus difficult to obtain a desired bandpass characteristic in this multilayer band pass filter.

SUMMARY OF THE INVENTION

Accordingly, preferred embodiments of the present invention provide an electronic component in which it is possible to significantly reduce or prevent the occurrence of parasitic capacitance in inductors.

According to a preferred embodiment of the present invention, an electronic component includes a multilayer body and a first resonator. The multilayer body includes a plurality of insulating layers stacked on each other in a stacking direction. The first resonator includes a first inductor and a first capacitor in the multilayer body. The first inductor is defined by connecting a conductive layer disposed on an insulating layer of the plurality of insulating layers and an interlayer connecting conductor which passes through an insulating layer of the plurality of insulating layers in the stacking direction so that the first inductor has a helical or substantially helical shape as viewed from a first direction perpendicular or substantially perpendicular to the stacking direction. A certain portion of the first inductor is located on a predetermined plane perpendicular or substantially perpendicular to the first direction, and a remaining portion of the first inductor is displaced from the predetermined plane in the first direction.

According to a preferred embodiment of the present invention, it is possible to significantly reduce or prevent the occurrence of parasitic capacitance in inductors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the invention will be described below with reference to the accompanying drawings.

First Preferred Embodiment

Figure 1A:
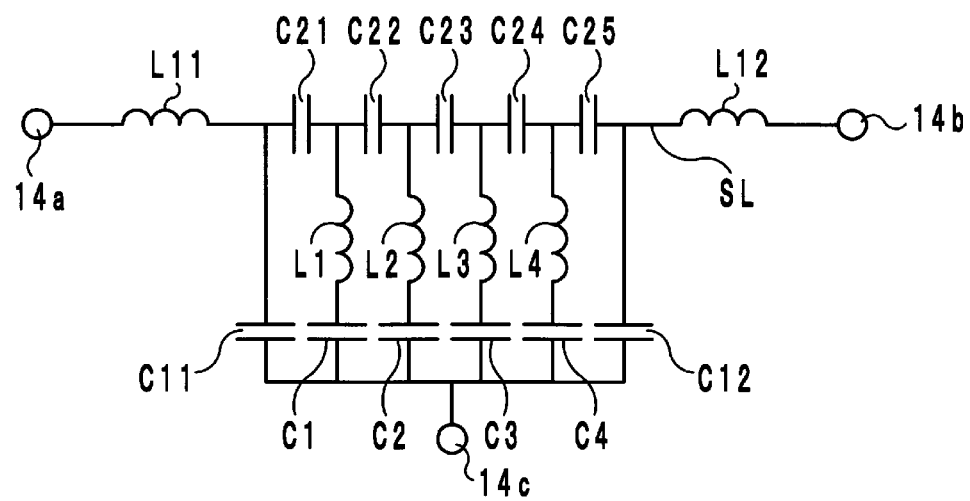
FIG. 1A is an equivalent circuit diagram of electronic components according to first and second preferred embodiments of the present invention.

An example of the circuit configuration of an electronic component 10a according to a first preferred embodiment of the present invention will first be described below with reference to the equivalent circuit diagram of FIG. 1A.

Figure 1B:
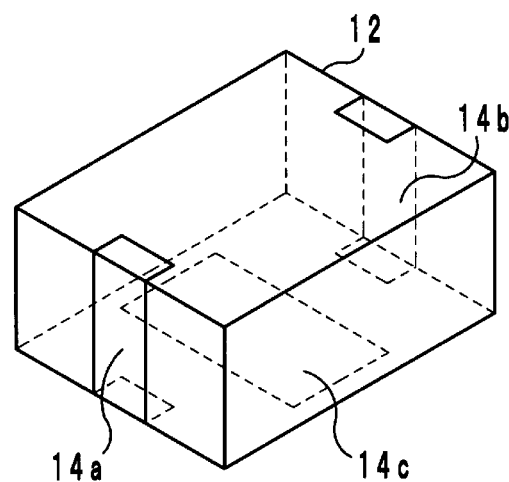
FIG. 1B is an external perspective view of electronic components according to first through fourth preferred embodiments of the present invention.
Figure 1B:
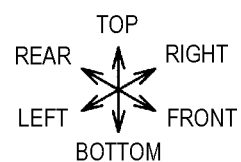
Figure 2:
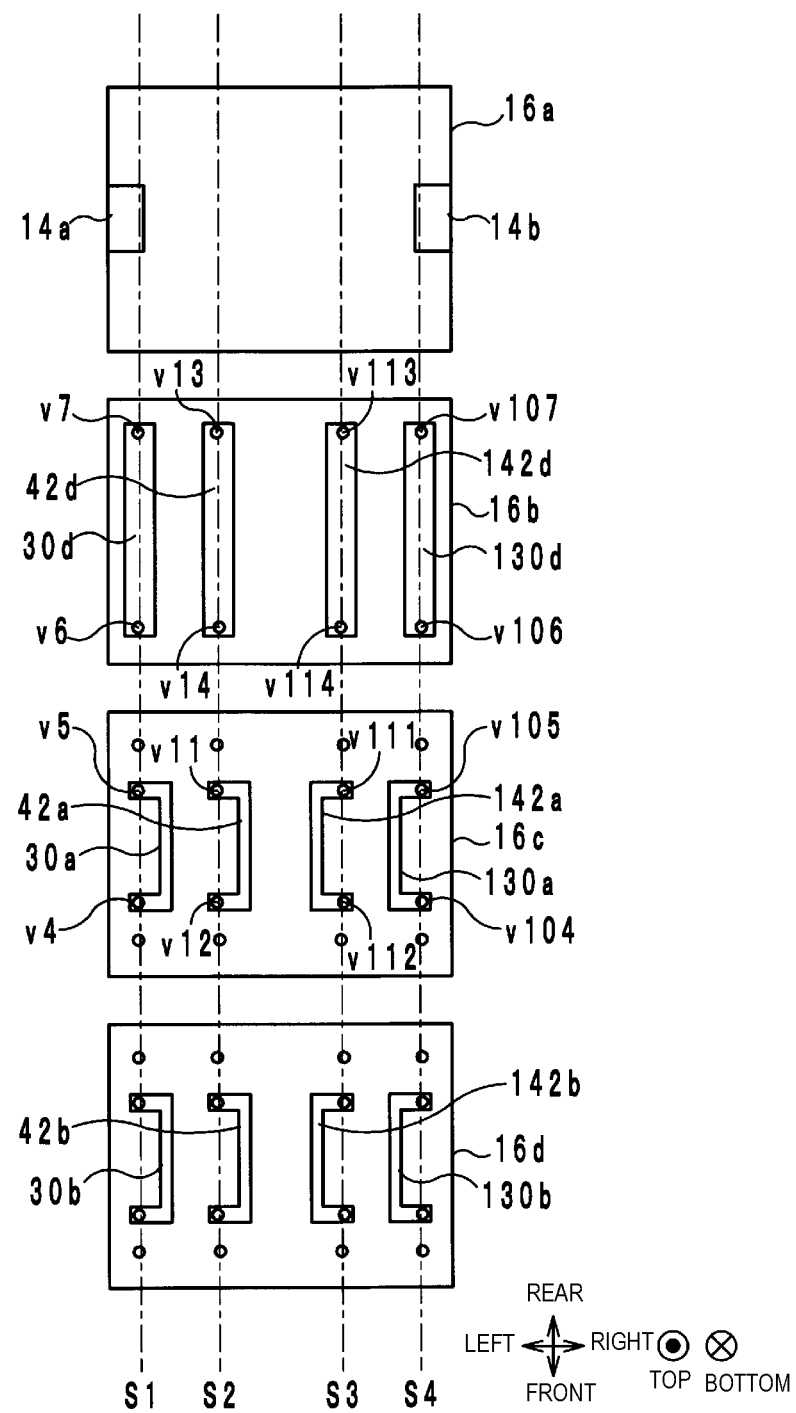
FIGS. 2 through 5 are exploded views of the electronic component according to the first preferred embodiment of the present invention.
Figure 3:
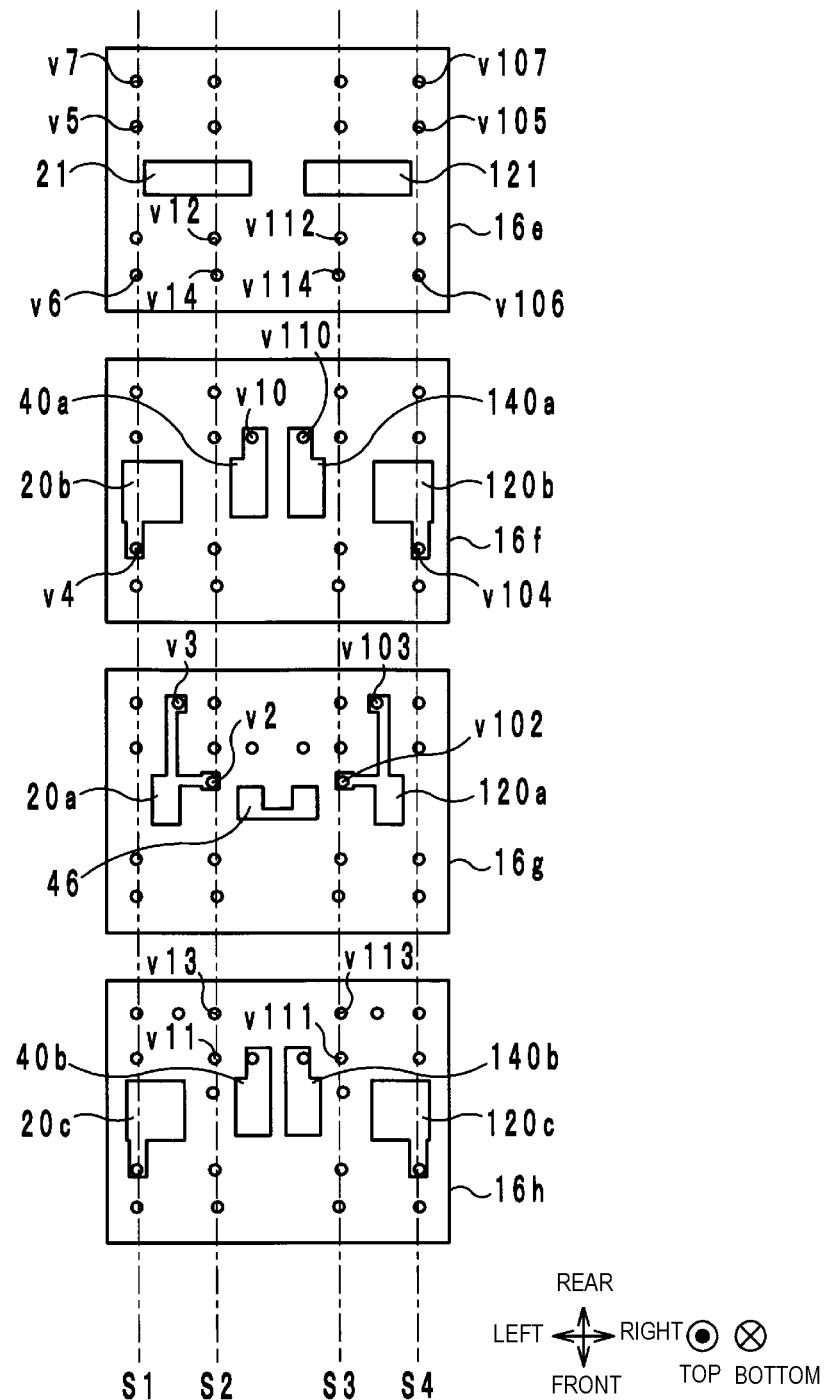
Figure 4:
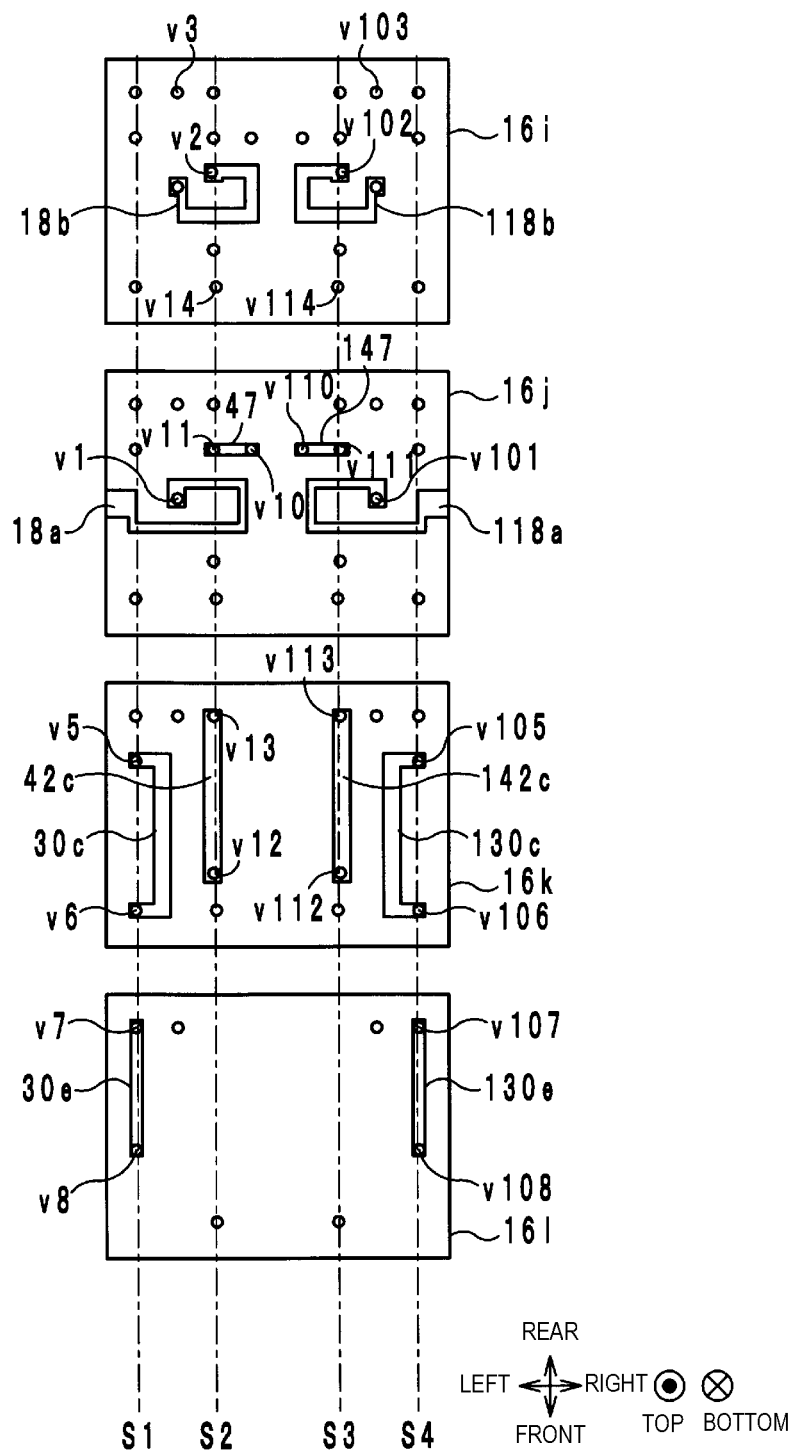
Figure 5:
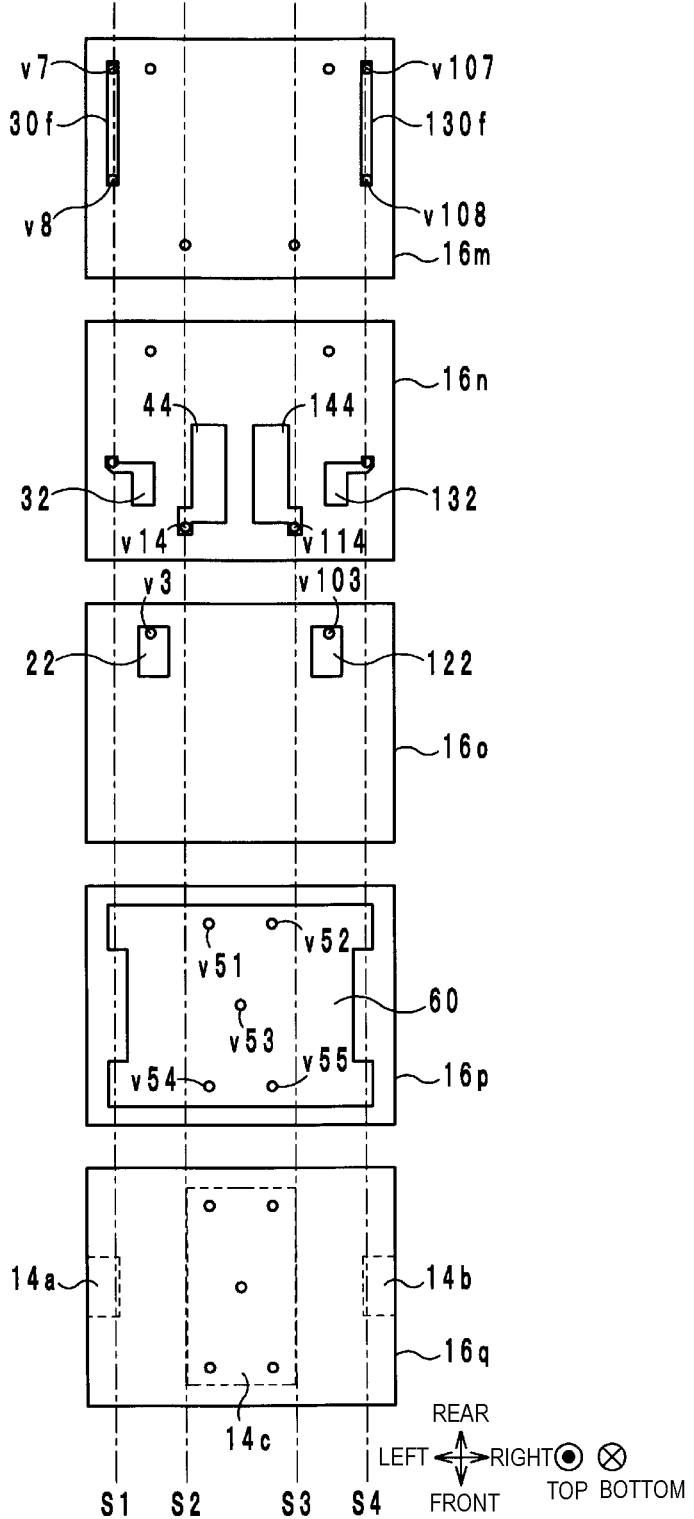

The electronic component 10a preferably is a band pass filter including outer electrodes 14a through 14c, inductors L1 through L4, L11, and L12 and capacitors C1 through C4, C11, C12, and C21 through C25, as shown in FIG. 1.

The outer electrodes 14a and 14b are input/output terminals into and from which a radio-frequency signal is input and output. The outer electrode 14c is a ground terminal which is connected to a ground potential. The outer electrodes 14a and 14b are connected to each other by a signal path SL.

The inductor L11, the capacitors C21 through C25, and the inductor L12 are disposed on the signal path SL, and are electrically connected in series with each other in this order from the outer electrode 14a to the outer electrode 14b.

The capacitor C11 is connected between the signal path SL and the outer electrode 14c. More specifically, the capacitor C11 is connected between the node between the inductor L11 and the capacitor C21 and the outer electrode 14c. With this configuration, the inductor L11 and the capacitor C11 define a low pass filter LPF1. The cutoff frequency of the low pass filter LPF1 is a frequency fc1.

The capacitor C12 is connected between the signal path SL and the outer electrode 14c. More specifically, the capacitor C12 is connected between the node between the inductor L12 and the capacitor C25 and the outer electrode 14c. With this configuration, the inductor L12 and the capacitor C12 define a low pass filter LPF2. The cutoff frequency of the low pass filter LPF2 is a frequency fc2. The frequency fc1 and the frequency fc2 are substantially the same.

The inductor L1 and the capacitor C1 are electrically connected in series with each other between the signal path SL and the outer electrode 14c so as to define an LC series resonator LC1. In the first preferred embodiment, the inductor L1 and the capacitor C1 are electrically connected in series with each other between a node between the capacitors C21 and C22 and the outer electrode 14c. The resonant frequency of the LC series resonator LC1 is a frequency fa1.

The inductor L2 and the capacitor C2 are electrically connected in series with each other between the signal path SL and the outer electrode 14c so as to define an LC series resonator LC2. In the first preferred embodiment, the inductor L2 and the capacitor C2 are electrically connected in series with each other between a node between the capacitors C22 and C23 and the outer electrode 14c. The resonant frequency of the LC series resonator LC2 is a frequency fa2.

The inductor L3 and the capacitor C3 are electrically connected in series with each other between the signal path SL and the outer electrode 14c so as to define an LC series resonator LC3. In the first preferred embodiment, the inductor L3 and the capacitor C3 are electrically connected in series with each other between a node between the capacitors C23 and C24 and the outer electrode 14c. The resonant frequency of the LC series resonator LC3 is a frequency fa3.

The inductor L4 and the capacitor C4 are electrically connected in series with each other between the signal path SL and the outer electrode 14c so as to define an LC series resonator LC4. In the first preferred embodiment, the inductor L4 and the capacitor C4 are electrically connected in series with each other between a node between the capacitors C24 and C25 and the outer electrode 14c. The resonant frequency of the LC series resonator LC4 is a frequency fa4.

The electronic component 10a is designed so that the frequencies fc1 and fc2 will be higher than the frequencies fa1 through fa4. With this arrangement, the LC series resonators LC1 through LC4 and the low pass filters LPF1 and LPF2 define a band pass filter that allows a radio-frequency signal in a band between the frequencies fc1 and fc2 and the frequencies fa1 through fa4 to pass through the band pass filter and transmits the radio-frequency signal from the outer electrode 14a to the outer electrode 14b.

The inductor L1 and the capacitors C21 and C22 define a high pass filter HPF1. The high pass filter HPF1 allows a radio-frequency signal in a band higher than a cutoff frequency fc11 to pass through the signal path SL.

The inductor L2 and the capacitors C22 and C23 define a high pass filter HPF2. The high pass filter HPF2 allows a radio-frequency signal in a band higher than a cutoff frequency fc12 to pass through the signal path SL.

The inductor L3 and the capacitors C23 and C24 define a high pass filter HPF3. The high pass filter HPF3 allows a radio-frequency signal in a band higher than a cutoff frequency fc13 to pass through the signal path SL.

The inductor L4 and the capacitors C24 and C25 define a high pass filter HPF4. The high pass filter HPF4 allows a radio-frequency signal in a band higher than a cutoff frequency fc14 to pass through the signal path SL.

An example of the specific configuration of the electronic component 10a will now be described below with reference to the drawings. FIG. 1B is an external perspective view of the electronic component 10a. FIGS. 2 through 5 are exploded views of the electronic component 10a. The stacking direction of a multilayer body 12 of the electronic component 10a is defined as the top-bottom direction. The longitudinal direction of the top surface of the electronic component 10a, as viewed from above, is defined as the right-left direction, and the widthwise direction of the top surface of the electronic component 10a, as viewed from above, is defined as the front-rear direction.

As shown in FIGS. 1B through 5, the electronic component 10a includes a multilayer body 12, outer electrodes 14a through 14c, inductor conductive layers 18a, 18b, 42a through 42d, 30a through 30f, 118a, 118b, 130a through 130f, and 142a through 142d, capacitor conductive layers 20a through 20c, 21, 22, 32, 40a, 40b, 44, 46, 60, 120a through 120c, 121, 122, 132, 140a, 140b, and 144, connecting conductive layers 47 and 147, and via-hole conductors (an example of an interlayer connecting conductor) v1 through v8, v10 through v14, v51 through v55, v101 through v108, and v110 through v114.

The multilayer body 12 preferably has a rectangular or substantially rectangular parallelepiped shape, and includes insulating layers 16a through 16q stacked on each other in this order from the top side to the bottom side. The insulating layers 16a through 16q preferably have a rectangular or substantially rectangular shape extending in the right-left direction, as viewed from above, and are made of an insulating material, such as ceramic. Hereinafter, the upper surfaces of the insulating layers 16a through 16q will be referred to as "top surfaces", and the lower surfaces thereof will be referred to as "bottom surfaces".

As shown in FIG. 1B, the outer electrodes 14a and 14b are respectively disposed on the left and right surfaces of the multilayer body 12, and preferably have a strip shape extending in the top-bottom direction. The top and bottom end portions of the outer electrodes 14a and 14b are bent to the top and bottom surfaces of the multilayer body 12.

As shown in FIG. 1B, the outer electrode 14c is disposed at or substantially at the center of the bottom surface of the multilayer body 12, and preferably is rectangular or substantially rectangular. The outer electrodes 14a through 14c are preferably formed by Ni- or Sn-plating on base electrodes made of, for example, silver.

The inductor conductive layer 18a is a linear conductive layer disposed on the top surface of the insulating layer 16j. The inductor conductive layer 18a extends from the center of the left side of the insulating layer 16j as a start point to the center of the left half region of the insulating layer 16j as an end point. The inductor conductive layer 18a turns from the start point to the end point counterclockwise. The inductor conductive layer 18a is connected to the outer electrode 14a.

The inductor conductive layer 18b is a linear conductive layer disposed on the top surface of the insulating layer 16i. The inductor conductive layer 18b extends from the center of the left half region of the insulating layer 16i as a start point to a point positioned on the right side of the start point as an end point. The inductor conductive layer 18b turns from the start point to the end point counterclockwise.

The via-hole conductor v1 passes through the insulating layer 16i in the top-bottom direction, and connects the end point of the inductor conductive layer 18a and the start point of the inductor conductive layer 18b. With this configuration, the inductor conductive layers 18a and 18b and the via-hole conductor v1 define the inductor L11 preferably with a helical or substantially helical shape.

The capacitor conductive layer 20a is disposed on the top surface of the insulating layer 16g, and includes a rectangular or substantially rectangular conductive layer and two linear conductive layers. The capacitor conductive layer 20a is disposed in the left half region of the insulating layer 16g. One linear conductive layer extends from the right side of the rectangular or substantially rectangular conductive layer toward the right side. The other linear conductive layer extends from the rear side of the rectangular or substantially rectangular conductive layer toward the rear side.

The capacitor conductive layer 20b is disposed on the top surface of the insulating layer 16f, and includes a rectangular or substantially rectangular conductive layer and one linear conductive layer. The capacitor conductive layer 20b is disposed in the left half region of the insulating layer 16f, and overlaps the capacitor conductive layer 20a, as viewed from above. The linear conductive layer of the capacitor conductive layer 20b extends from the front side of the rectangular or substantially rectangular conductive layer toward the front side.

The capacitor conductive layer 20c is disposed on the top surface of the insulating layer 16h, and includes a rectangular or substantially rectangular conductive layer and one linear conductive layer. The capacitor conductive layer 20c is disposed in the left half region of the insulating layer 16h, and overlaps the capacitor conductive layer 20a, as viewed from above. The linear conductive layer of the capacitor conductive layer 20c extends from the front side of the rectangular or substantially rectangular conductive layer toward the front side. With the above-described configuration, the capacitor conductive layers 20a through 20c define the capacitor C21.

The via-hole conductor v2 passes through the insulating layers 16g and 16h in the top-bottom direction, and connects the end point of the inductor conductive layer 18b and the right end of the capacitor conductive layer 20a. With this configuration, the inductor L11 and the capacitor C21 are electrically connected in series with each other.

The capacitor conductive layer 22 is a rectangular or substantially rectangular conductive layer disposed on the top surface of the insulating layer 16o. The capacitor conductive layer 22 is disposed near the rear end of the left half region of the insulating layer 16o.

The capacitor conductive layer 60 is a rectangular or substantially rectangular conductive layer disposed on the top surface of the insulating layer 16p. The capacitor conductive layer 60 covers substantially the entirety of the top surface of the insulating layer 16p and is superposed on the capacitor conductive layer 22, as viewed from above. With this configuration, the capacitor conductive layers 22 and 60 define the capacitor C11.

The via-hole conductor v3 passes through the insulating layers 16g through 16n in the top-bottom direction, and connects the rear end of the capacitor conductive layer 20a and the rear end of the capacitor conductive layer 22. With this configuration, the capacitor C11, the inductor L11, and the capacitor C21 are connected to each other.

The via-hole conductors v51 through v55 pass through the insulating layers 16p and 16q in the top-bottom direction, and connect the capacitor conductive layer 60 and the outer electrode 14c. With this configuration, the capacitor C11 and the outer electrode 14c are connected to each other.

The inductor conductive layer 30a is a linear conductive layer disposed on the top surface of the insulating layer 16c and extending along the left side of the insulating layer 16c. The front and rear ends of the inductor conductive layer 30a are bent toward the left side. With this configuration, the inductor conductive layer 30a preferably has an angular U-shape or substantially angular U-shape structure opened on the left side.

The inductor conductive layer 30b is a linear conductive layer disposed on the top surface of the insulating layer 16d and extending along the left side of the insulating layer 16d. The front and rear ends of the inductor conductive layer 30b are bent toward the left side. With this configuration, the inductor conductive layer 30b preferably has an angular U-shape or substantially angular U-shape structure opened on the left side. The inductor conductive layers 30a and 30b are superposed on each other such that they coincide with each other, as viewed from above.

The via-hole conductor v4 passes through the insulating layers 16c through 16g in the top-bottom direction, and connects the front ends of the capacitor conductive layers 20b and 20c and the front ends of the inductor conductive layers 30a and 30b.

The inductor conductive layer 30c is a linear conductive layer disposed on the top surface of the insulating layer 16k and extending along the left side of the insulating layer 16k. The front and rear ends of the inductor conductive layer 30c are bent toward the left side. With this configuration, the inductor conductive layer 30c preferably has an angular U-shape or substantially angular U-shape structure opened on the left side. The front end of the inductor conductive layer 30c is positioned farther frontward than the front ends of the inductor conductive layers 30a and 30b, as viewed from above. The rear end of the inductor conductive layer 30c is superposed on the rear ends of the inductor conductive layers 30a and 30b.

The via-hole conductor v5 passes through the insulating layers 16c through 16j in the top-bottom direction, and connects the rear ends of the inductor conductive layers 30a and 30b and the rear end of the inductor conductive layer 30c.

The inductor conductive layer 30d is a linear conductive layer disposed on the top surface of the insulating layer 16b and extending along the left side of the insulating layer 16b. The front and rear ends of the inductor conductive layer 30d are not bent toward the left side. With this configuration, the inductor conductive layer 30d is superposed on both ends of each of the inductor conductive layers 30a through 30c but is not superposed on the other portions thereof, as viewed from above. The front end of the inductor conductive layer 30d is superposed on the front end of the inductor conductive layer 30c. The rear end of the inductor conductive layer 30d is located farther rearward than the rear end of the inductor conductive layer 30c, as viewed from above.

The via-hole conductor v6 passes through the insulating layers 16b through 16j in the top-bottom direction, and connects the front end of the inductor conductive layer 30c and the front end of the inductor conductive layer 30d.

The inductor conductive layer 30e is a linear conductive layer disposed on the top surface of the insulating layer 16l and extending along the left side of the insulating layer 16l. The front and rear ends of the inductor conductive layer 30e are not bent toward the left side. With this configuration, the inductor conductive layer 30e is superposed on the rear ends of the inductor conductive layers 30a through 30c but is not superposed on the other portions thereof, as viewed from above. The rear end of the inductor conductive layer 30e is superposed on the rear end of the inductor conductive layer 30d. The front end of the inductor conductive layer 30e is located near the center of the left side of the insulating layer 16l, as viewed from above.

The inductor conductive layer 30f is a linear conductive layer disposed on the top surface of the insulating layer 16m and extending along the left side of the insulating layer 16m. The front and rear ends of the inductor conductive layer 30f are not bent toward the left side. With this configuration, the inductor conductive layer 30f is superposed on the rear ends of the inductor conductive layers 30a through 30c but is not superposed on the other portions thereof, as viewed from above. The inductor conductive layers 30e and 30f are superposed on each other such that they coincide with each other, as viewed from above. The rear end of the inductor conductive layer 30f is superposed on the rear end of the inductor conductive layer 30d. The front end of the inductor conductive layer 30f is located near the center of the left side of the insulating layer 16m, as viewed from above.

The via-hole conductor v7 passes through the insulating layers 16b through 16l in the top-bottom direction, and connects the rear end of the inductor conductive layer 30d and the rear ends of the inductor conductive layers 30e and 30f.

The inductor conductive layers 30a through 30f and the via-hole conductors v4 through v7 are connected to each other in the above-described manner so as to define the inductor L1. With the above-described configuration, the inductor L1 preferably has a helical or substantially helical shape, as viewed from the right-left direction (direction perpendicular or substantially perpendicular to the stacking direction). In the first preferred embodiment, the inductor L1 extends from inward to outward while turning counterclockwise, as viewed from the left side. Since the via-hole conductor v4 is connected to the capacitor conductive layers 20b and 20c, the inductor L1 is connected to the capacitor C21.

The inductor L1 includes the inductor conductive layer 30a positioned inward and the inductor conductive layer 30d positioned outward adjacent to each other. Both ends of the inductor conductive layer 30a are superposed on the inductor conductive layer 30d, as viewed from above. Portions of the inductor conductive layer 30a other than both ends thereof are located farther rightward than the inductor conductive layer 30d, as viewed from above. With this configuration, at least a portion of the inductor conductive layer 30a is displaced farther rightward than the inductor conductive layer 30d.

The inductor L1 includes the inductor conductive layer 30c positioned inward and the inductor conductive layer 30e positioned outward adjacent to each other. The rear end of the inductor conductive layer 30c is superposed on the inductor conductive layer 30e, as viewed from above. Portions of the inductor conductive layer 30c other than the rear end are located farther rightward than the inductor conductive layer 30e, as viewed from above. With this configuration, at least a portion of the inductor conductive layer 30c is displaced farther rightward than the inductor conductive layer 30e.

In the inductor L1 configured as described above, a certain portion of the inductor L1 is located on a plane S1 perpendicular or substantially perpendicular to the right-left direction, and the remaining portion of the inductor L1 is located farther rightward than the plane S1. More specifically, both ends of the inductor conductive layers 30a through 30c, the inductor conductive layers 30d through 30f, and the via-hole conductors v4 through v7 of the inductor L1 are located on the plane S1, while portions of the inductor conductive layers 30a through 30c other than both ends thereof are located farther rightward than the plane S1.

The capacitor conductive layer 32 is a rectangular or substantially rectangular conductive layer disposed on the top surface of the insulating layer 16n. The capacitor conductive layer 32 is disposed in the left half region of the insulating layer 16n. The capacitor conductive layer 32 is superposed on the capacitor conductive layer 60, as viewed from above. With this configuration, the capacitor conductive layers 32 and 60 define the capacitor C1.

The via-hole conductor v8 passes through the insulating layers 16l and 16m in the top-bottom direction, and connects the front end of the inductor conductive layer 30f and the capacitor conductive layer 32. With this configuration, the inductor L1 and the capacitor C1 are connected to each other. Since the capacitor conductive layer 60 is connected to the outer electrode 14c by the via-hole conductors v51 through v55, the capacitor C1 is connected to the outer electrode 14c.

The capacitor conductive layer 40a is a rectangular or substantially rectangular conductive layer disposed on the top surface of the insulating layer 16f. The capacitor conductive layer 40a is located farther leftward than the center (intersection of diagonal lines) of the insulating layer 16f.

The capacitor conductive layer 40b is a rectangular or substantially rectangular conductive layer disposed on the top surface of the insulating layer 16h. The capacitor conductive layer 40b is located farther leftward than the center (intersection of diagonal lines) of the insulating layer 16h. The capacitor conductive layers 40a and 40b are superposed on each other such that they coincide with each other, as viewed from above.

The capacitor conductive layer 21 is a rectangular or substantially rectangular conductive layer disposed on the top surface of the insulating layer 16e. The capacitor conductive layer 21 extends in the right-left direction substantially at the center of the insulating layer 16e in the front-rear direction. The capacitor conductive layer 21 overlaps the capacitor conductive layers 40a and 20b, as viewed from above. With this configuration, the capacitor conductive layers 20b, 21, and 40a define the capacitor C22.

The inductor conductive layer 42a is a linear conductive layer disposed on the top surface of the insulating layer 16c. The inductor conductive layer 42a extends in the front-rear direction and is located on the right side of the inductor conductive layer 30a. The front and rear ends of the inductor conductive layer 42a are bent toward the left side. With this configuration, the inductor conductive layer 42a preferably has an angular U-shape or substantially angular U-shape structure opened on the left side.

The inductor conductive layer 42b is a linear conductive layer disposed on the top surface of the insulating layer 16d. The inductor conductive layer 42b extends in the front-rear direction and is located on the right side of the inductor conductive layer 30b. The front and rear ends of the inductor conductive layer 42b are bent toward the left side. With this configuration, the inductor conductive layer 42b preferably has an angular U-shape or substantially angular U-shape structure opened on the left side. The inductor conductive layers 42a and 42b are superposed on each other such that they coincide with each other, as viewed from above.

The via-hole conductor v11 passes through the insulating layers 16c through 16i in the top-bottom direction. The top end of the via-hole conductor v11 is connected to the rear ends of the inductor conductive layers 42a and 42b.

The inductor conductive layer 42c is a linear conductive layer disposed on the top surface of the insulating layer 16k. The inductor conductive layer 42c extends in the front-rear direction and is located on the right side of the inductor conductive layer 30c. The front and rear ends of the inductor conductive layer 42c are not bent toward the left side. The front end of the inductor conductive layer 42c is superposed on the front ends of the inductor conductive layers 42a and 42b, as viewed from above. The rear end of the inductor conductive layer 42c is located farther rearward than the rear ends of the inductor conductive layers 42a and 42b, as viewed from above.

The via-hole conductor v12 passes through the insulating layers 16c through 16j in the top-bottom direction, and connects the front ends of the inductor conductive layers 42a and 42b and the front end of the inductor conductive layer 42c.

The inductor conductive layer 42d is a linear conductive layer disposed on the top surface of the insulating layer 16b. The inductor conductive layer 42d extends in the front-rear direction and is located on the right side of the inductor conductive layer 30d. The front and rear ends of the inductor conductive layer 42d are not bent toward the left side. With this configuration, the inductor conductive layer 42d is superposed on both ends of each of the inductor conductive layers 42a and 42b but is not superposed on the other portions thereof, as viewed from above. The rear end of the inductor conductive layer 42d is superposed on the rear end of the inductor conductive layer 42c, as viewed from above. The front end of the inductor conductive layer 42d is located farther frontward than the front end of the inductor conductive layer 42c, as viewed from above.

The via-hole conductor v13 passes through the insulating layers 16b through 16j in the top-bottom direction, and connects the rear end of the inductor conductive layer 42c and the rear end of the inductor conductive layer 42d.

The via-hole conductor v14 passes through the insulating layers 16b through 16m in the top-bottom direction. The top end of the via-hole conductor v14 is connected to the front end of the inductor conductive layer 42d.

The inductor conductive layers 42a through 42c and the via-hole conductors v11 through v14 are connected to each other in the above-described manner so as to define the inductor L2. With the above-described configuration, the inductor L2 preferably has a helical or substantially helical shape, as viewed from the right-left direction (direction perpendicular or substantially perpendicular to the stacking direction). In the first preferred embodiment, the inductor L2 extends from inward to outward while turning clockwise, as viewed from the left side.

The inductor L2 includes the inductor conductive layer 42a positioned inward and the inductor conductive layer 42d positioned outward adjacent to each other. Both ends of the inductor conductive layer 42a are superposed on the inductor conductive layer 42d, as viewed from above. Portions of the inductor conductive layer 42a other than both ends thereof are located farther rightward than the inductor conductive layer 42d, as viewed from above. With this configuration, at least a portion of the inductor conductive layer 42a is displaced farther rightward than the inductor conductive layer 42d.

In the inductor L2 configured as described above, a certain portion of the inductor L2 is located on a plane S2 perpendicular or substantially perpendicular to the right-left direction, and the remaining portion of the inductor L2 is located farther rightward than the plane S2. More specifically, both ends of the inductor conductive layers 42a and 42b, the inductor conductive layers 42c and 42d, and the via-hole conductors v11 through v14 of the inductor L2 are located on the plane S2, while portions of the inductor conductive layers 42a and 42b other than both ends thereof are located farther rightward than the plane S2.

The connecting conductive layer 47 is a linear conductive layer disposed on the insulating layer 16j and extending in the right-left direction at the top left of the center of the insulating layer 16j.

The via-hole conductor v10 passes through the insulating layers 16f through 16i in the top-bottom direction, and connects the rear ends of the capacitor conductive layers 40a and 40b and the right end of the connecting conductive layer 47. The bottom end of the via-hole conductor v11 is connected to the left end of the connecting conductive layer 47. With this configuration, the inductor L2 is connected to the capacitor C22 by the connecting conductive layer 47 and the via-hole conductor v10.

The capacitor conductive layer 44 is a rectangular or substantially rectangular conductive layer disposed on the top surface of the insulating layer 16n. The capacitor conductive layer 44 is disposed in the left half region of the insulating layer 16n. The capacitor conductive layer 44 is superposed on the capacitor conductive layer 60, as viewed from above. With this configuration, the capacitor conductive layers 44 and 60 define the capacitor C2.

The bottom end of the via-hole conductor v14 is connected to the capacitor conductive layer 44. Accordingly, the inductor L2 and the capacitor C2 are connected to each other. Since the capacitor conductive layer 60 is connected to the outer electrode 14c by using the via-hole conductors v51 through v55, the capacitor C2 is connected to the outer electrode 14c.

The inductor conductive layers 118a, 118b, 130a through 130f, 142a through 142c, the capacitor conductive layers 120a through 120c, 121, 122, 132, 140a, 140b, and 144, the connecting conductive layer 147, and the via-hole conductors v101 through v108 and v110 through v114 are respectively line-symmetrical to the inductor conductive layers 18a, 18b, 30a through 30f, 42a through 42c, the capacitor conductive layers 20a through 20c, 21, 22, 32, 40a, 40b, and 44, the connecting conductive layer 47, and the via-hole conductors v1 through v8 and v10 through v14 with respect to a straight line passing through the front-rear direction at the center of the top surface of the multilayer body 12, as viewed from above. Accordingly, an explanation of the inductor conductive layers 118a, 118b, 130a through 130f, 142a through 142c, the capacitor conductive layers 120a through 120c, 121, 122, 132, 140a, 140b, and 144, the connecting conductive layer 147, and the via-hole conductors v101 through v108 and v110 through v114 will be omitted.

The capacitor conductive layer 46 is disposed on the top surface of the insulating layer 16g, and includes two rectangular or substantially rectangular conductive layers and one linear conductive layer. One rectangular or substantially rectangular conductive layer overlaps the capacitor conductive layers 40a and 40b, as viewed from above. The other rectangular or substantially rectangular conductive layer overlaps the capacitor conductive layers 140a and 140b, as viewed from above. The linear conductive layer connects the two rectangular or substantially rectangular conductive layers. With this configuration, the capacitor conductive layers 40a, 40b, 46, 140a, and 140b define the capacitor C23.

The above-described inductor conductive layers, capacitor conductive layers, connecting conductive layers, and via-hole conductors are formed by, for example, a conductive paste made of, for example, silver, as a main component.

By using the electronic component 10a with the unique structure and configuration described above, it is possible to reduce the occurrence of parasitic capacitance in the inductor L1. More specifically, a certain portion of the inductor L1 is located on the plane S1, while the remaining portion of the inductor L1 is located farther rightward than the plane S1. With this configuration, the occurrence of parasitic capacitance between the certain portion and the remaining portion of the inductor L1 is significantly reduced or prevented. As a result, the occurrence of parasitic capacitance in the overall inductor L1 is significantly reduced or prevented. In the inductors L2 through L4 as well as in the inductor L1, the occurrence of parasitic capacitance is significantly reduced or prevented for the same reason described above.

Parasitic capacitance is likely to occur in the inductor conductive layers 30a and 30d adjacent to each other in the stacking direction. To handle this situation, at least a portion of the inductor conductive layer 30a is displaced rightward from the inductor conductive layer 30d. With this arrangement, it is possible to effectively reduce or prevent the occurrence of parasitic capacitance in the inductor L1. In the inductors L2 through L4 as well as in the inductor L1, the occurrence of parasitic capacitance is significantly reduced or prevented for the same reason described above.

If the occurrence of parasitic capacitance in the inductors L1 through L4 is reduced or prevented as discussed above, the pass band of the electronic component 10a is increased. This will be discussed more specifically. If the occurrence of parasitic capacitance in the inductors L1 through L4 is increased, the inductors L1 through L4 which respectively serve as the LC series resonators LC1 through LC4 define and function as LC parallel resonators. The impedance values of the four LC parallel resonators become infinite at the associated resonant frequencies. Accordingly, radio-frequency signals at the resonant frequencies of the four LC parallel resonators do not flow to the outer electrode 14c but flow through the signal path SL. Since the resonant frequencies of the four LC parallel resonators are relatively close to each other, the electronic component 10a defines and functions as a narrow-band band pass filter.

In view of the above-described situation, in the electronic component 10a, the occurrence of parasitic capacitance in the inductors L1 through L4 is significantly reduced or prevented. Accordingly, it is less likely that the inductors L1 through L4 will serve as LC parallel resonators. It is thus possible to decrease the possibility that the electronic component 10a serve as a narrow-band band pass filter.

Regarding the bandpass characteristic of the electronic component 10a, the falling edge at the cutoff frequency of the high frequency side becomes sharp. This will be discussed more specifically. The electronic component 10a includes the low pass filters LPF1 and LPF2. The cutoff frequencies of the low pass filers LPF1 and LPF2 are fc1 and fc2, respectively. That is, the low pass filters LPF1 and LPF2 respectively allow radio-frequency signals of frequencies lower than the cutoff frequencies fc1 and fc2 to pass through the low pass filters LPF1 and LPF2. In the electronic component 10a, therefore, the cutoff frequencies fc1 and fc2 are set to coincide with the cutoff frequency of the high frequency side in the bandpass characteristic of the electronic component 10a. As a result, the falling edge of the bandpass characteristic of the electronic component 10a at the cutoff frequency of the high frequency side becomes sharp.

There is another reason why the falling edge of the bandpass characteristic of the electronic component 10a at the cutoff frequency of the high frequency side becomes sharp. This will be discussed more specifically. The electronic component 10a includes the low pass filters LPF1 and LPF2. The low pass filters LPF1 and LPF2 define and function as impedance matching circuits. This makes it possible to reduce the reflection of radio-frequency signals within the electronic component 10a. Particularly, the reflection of radio-frequency signals of a frequency slightly lower than the cutoff frequency of the high frequency side in the bandpass characteristic of the electronic component 10a is reduced. Accordingly, the attenuation becomes smaller in a frequency slightly lower than the cutoff frequency of the high frequency side. As a result, before the frequency reaches the cutoff frequency of the high frequency side, the attenuation is small, and after the frequency exceeds this cutoff frequency, the attenuation is increased. That is, the falling edge of the bandpass characteristic of the electronic component 10a at the cutoff frequency of the high frequency side becomes sharp.

For clarifying the advantages achieved by the electronic component 10a, the inventor of this application conducted the following computer simulations. A first model having the structure of the electronic component 10a was created. A second model was created by removing the low pass filters LPF1 and LPF2 from the electronic component 10a as a comparative example.

Figure 6A:
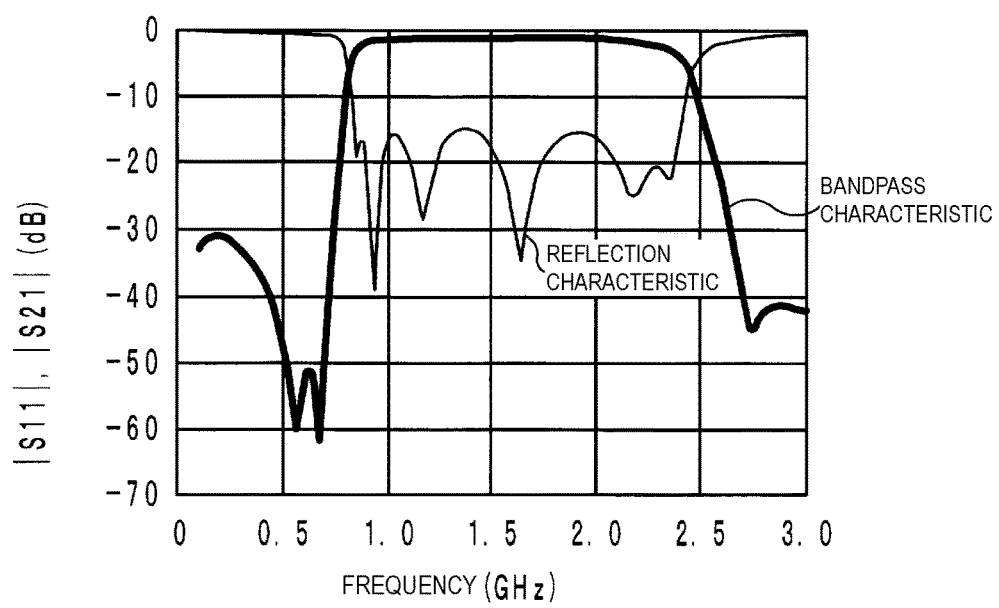
FIGS. 6A and 6B are graphs illustrating a bandpass characteristic and a reflection characteristic of a first model and those of a second model, respectively.
Figure 6B:
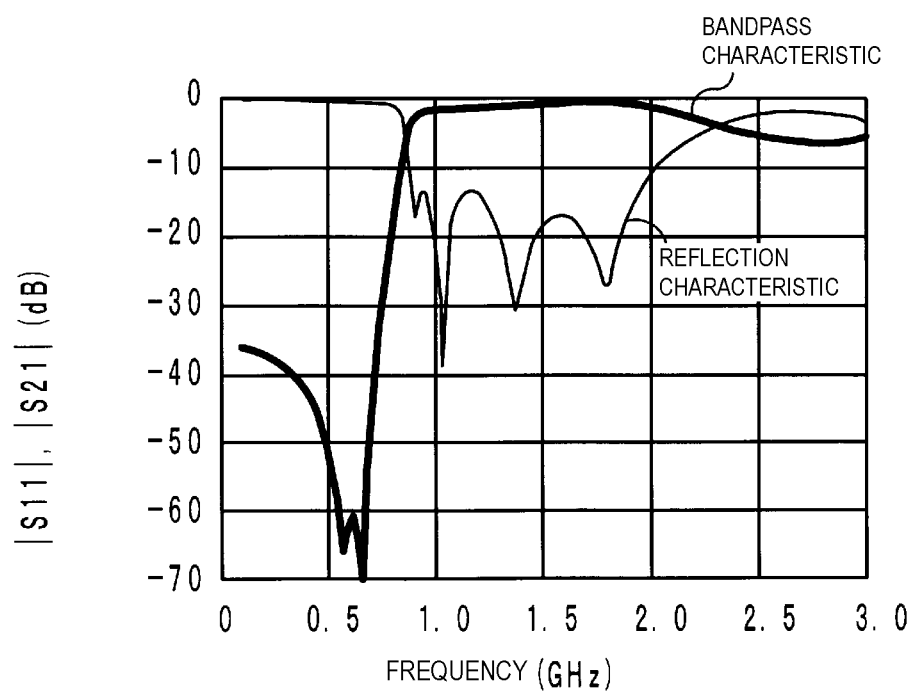
Figure 7:
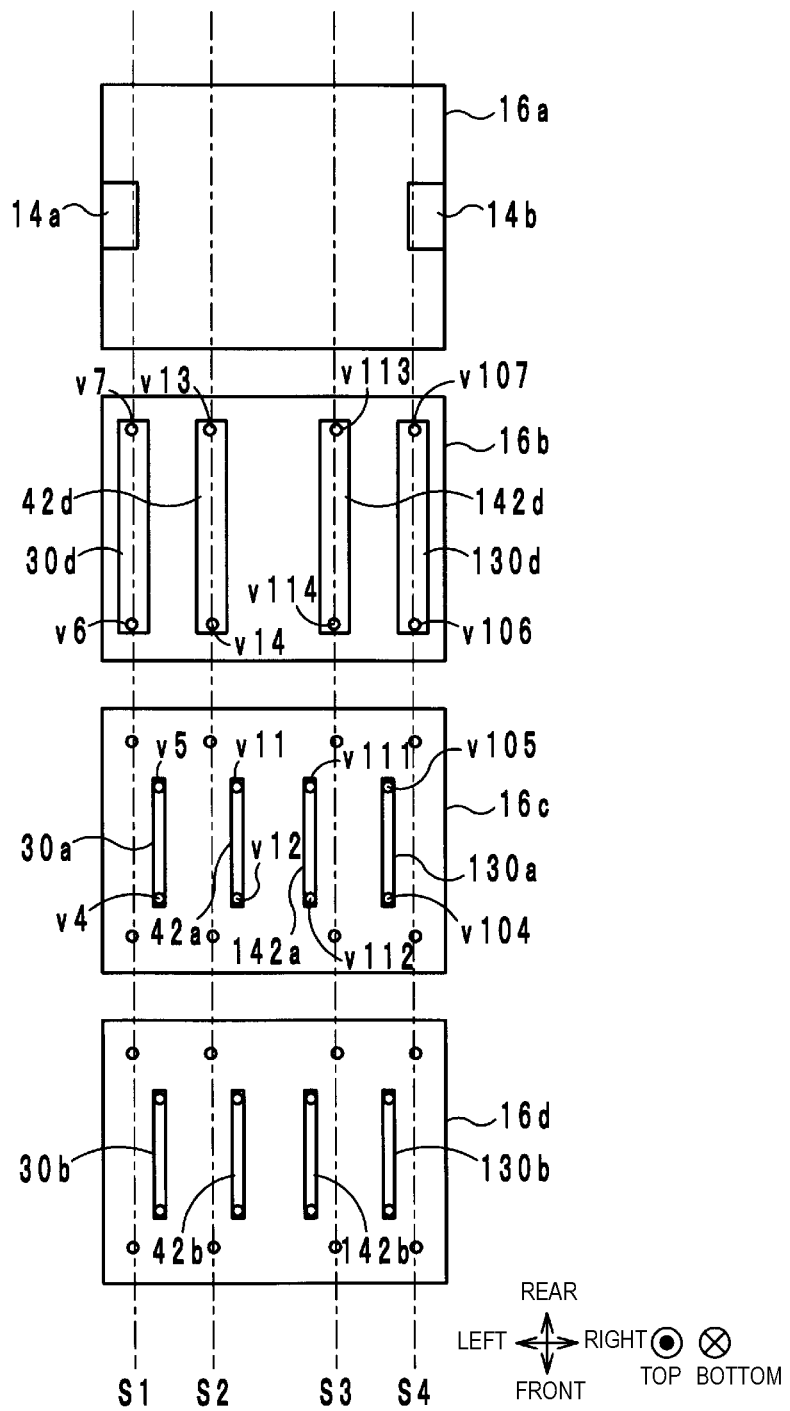
FIGS. 7 through 10 are exploded views of the electronic component according to the second preferred embodiment of the present invention.
Figure 8:
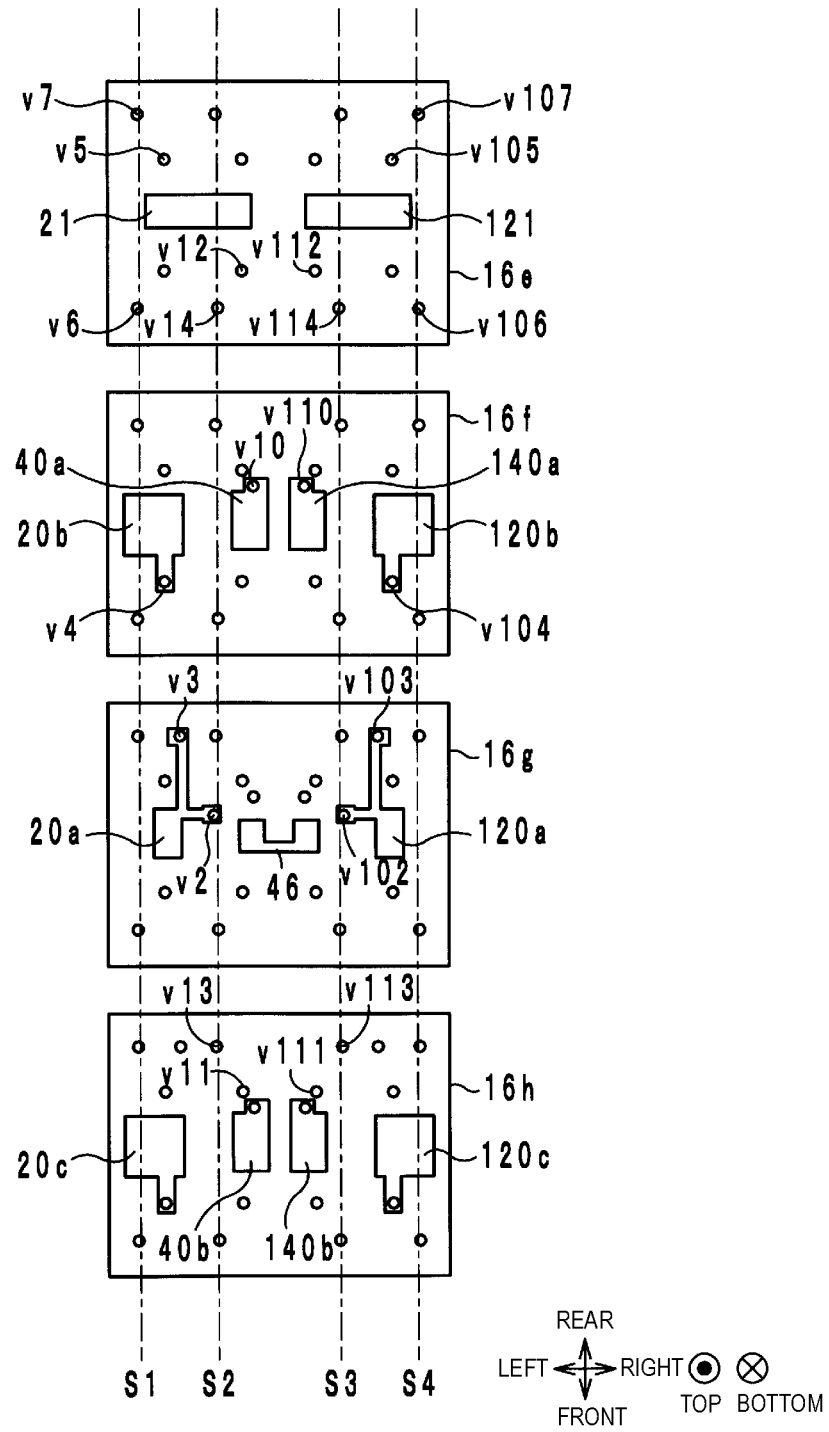
Figure 9:
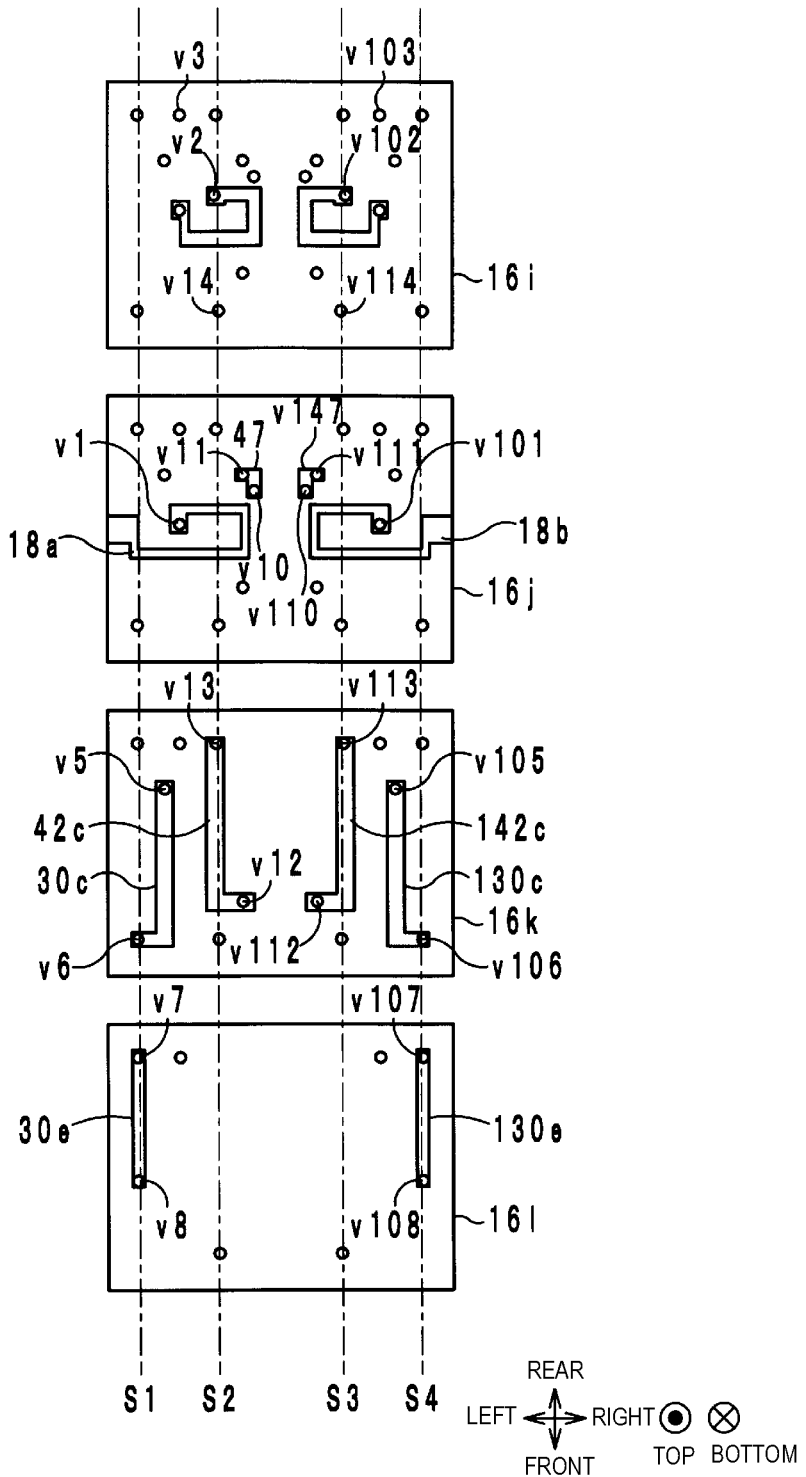
Figure 10:
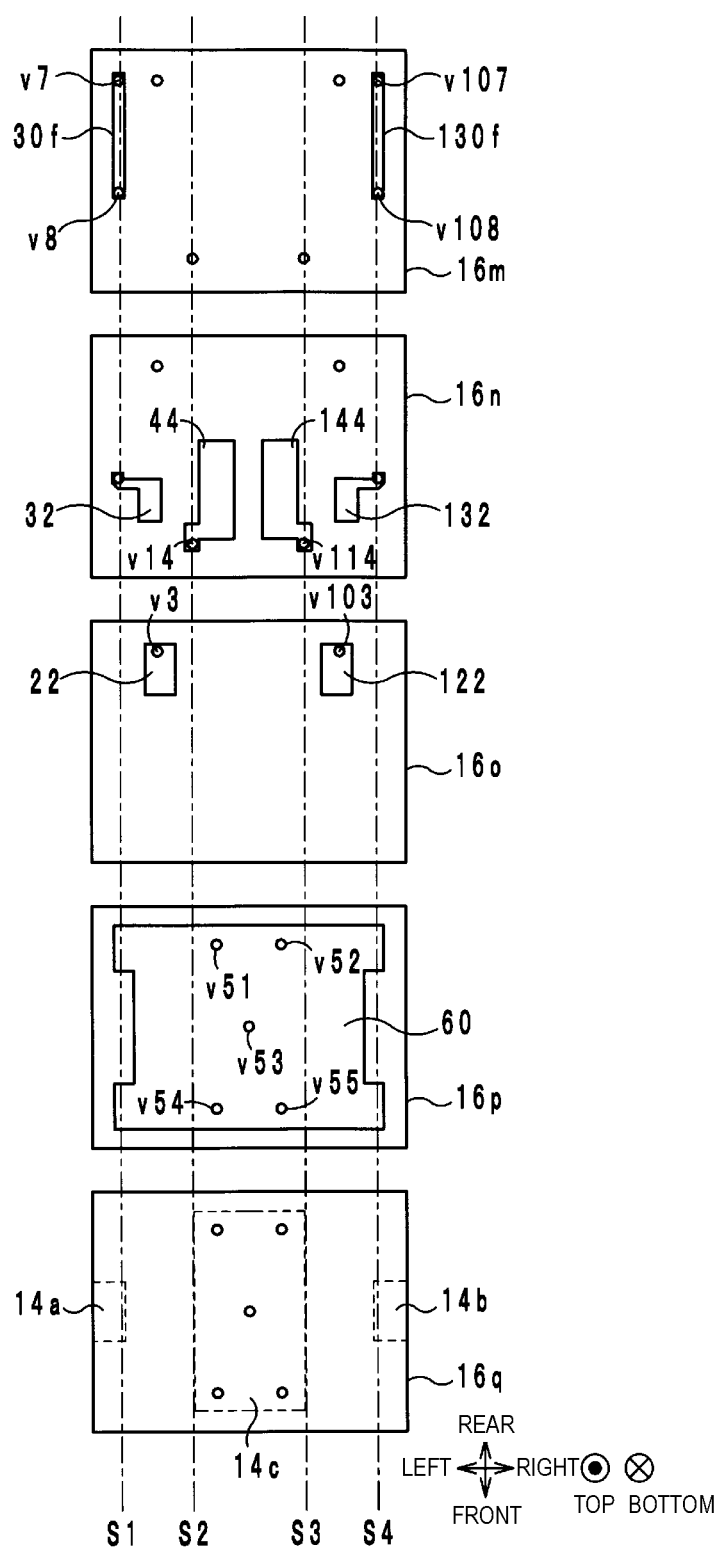

The bandpass characteristic and the reflection characteristic were calculated by using the first model and the second model. FIG. 6A is a graph illustrating the bandpass characteristic (S21) and the reflection characteristic (S11) of the first model. FIG. 6B is a graph illustrating the bandpass characteristic (S21) and the reflection characteristic (S11) of the second model. In FIGS. 6A and 6B, the vertical axis indicates |S11| and |S21|, while the horizontal axis indicates the frequency.

FIG. 6B shows that the falling edge of the bandpass characteristic at the cutoff frequency of the high frequency side is gentle. In contrast, FIG. 6A shows that the falling edge of the bandpass characteristic at the cutoff frequency of the high frequency side is sharp. Thus, it is seen that the falling edge at the cutoff frequency of the high frequency side becomes sharp by the provision of the low pass filters LPF1 and LPF2.

The reflection characteristic shown in FIG. 6B indicates that a peak is not formed near a frequency of 2.0 GHz, which is close to the cutoff frequency of the high frequency side. In contrast, the reflection characteristic shown in FIG. 6A indicates that two peaks are formed in a range of 2.0 to 2.5 GHz, which is close to the cutoff frequency of the high frequency side. The reason for this is that the low pass filters LPF1 and LPF2 define and function as impedance matching circuits. As a result, the reflection of radio-frequency signals of a frequency slightly lower than the cutoff frequency of the high frequency side in the bandpass characteristic of the first model is reduced. Accordingly, regarding the bandpass characteristic of the first model, the attenuation is small in a frequency slightly lower than the cutoff frequency of the high frequency side, and after the frequency exceeds this cutoff frequency, the attenuation is increased. That is, the falling edge of the bandpass characteristic of the first model at the cutoff frequency of the high frequency side becomes sharp.

Second Preferred Embodiment

An example of the configuration of an electronic component 10b according to a second preferred embodiment of the prevent invention will be described below with reference to the accompanying drawings. FIG. 1A is used for explaining the equivalent circuit of the electronic component 10b since it is the same as that of the electronic component 10a. FIG. 1B is used for explaining the external perspective view of the electronic component 10b since it is the same as that of the electronic component 10a. FIGS. 7 through 10 are exploded views of the electronic component 10b.

The electronic component 10b differs from the electronic component 10a in the structure of the inductors L1 through L4. Accordingly, the electronic component 10b will be discussed mainly by referring to this point.

In the electronic component 10a, both ends of the inductor conductive layer 30a positioned inward are superposed on the inductor conductive layer 30d positioned outward, as viewed from above. Portions of the inductor conductive layer 30a other than both ends thereof are located farther rightward than the inductor conductive layer 30d, as viewed from above. Similarly, the rear end of the inductor conductive layer 30c positioned inward is superposed on the inductor conductive layer 30e positioned outward, as viewed from above. Portions of the inductor conductive layer 30c other than the rear end thereof are located farther rightward than the inductor conductive layer 30e, as viewed from above.

On the other hand, in the electronic component 10b, the entirety of the inductor conductive layer 30a positioned inward is located farther rightward than the inductor conductive layer 30d positioned outward, as viewed from above. The inductor conductive layer 30c positioned inward is located farther rightward than the inductor conductive layer 30e positioned outward, as viewed from above. With this configuration, the via-hole conductors v6 and v7 are located on a plane S1, while the via-hole conductors v4 and v5 are not located on the plane S1. That is, the via-hole conductor v4 positioned inward and the via-hole conductor v6 positioned outward adjacent to each other are displaced from each other in the right-left direction. The via-hole conductor v5 positioned inward and the via-hole conductor v7 positioned outward adjacent to each other are displaced from each other in the right-left direction. The inductors L2 through L4 are configured in a manner similar to the inductor L1.

The electronic component 10b configured as described above achieves the same advantages as those of the electronic component 10a.

In the electronic component 10b, the occurrence of parasitic capacitance in the inductor L1 is more effectively reduced because of the following reason. In the inductor L1, parasitic capacitance is likely to occur between the adjacent via-hole conductors v4 and v6 and between the adjacent via-hole conductors v5 and v7. Accordingly, the inward via-hole conductor v4 and the outward via-hole conductor v6 adjacent to each other are displaced from each other in the right-left direction, and the inward via-hole conductor v5 and the outward via-hole conductor v7 adjacent to each other are displaced from each other in the right-left direction. This makes it possible to reduce the occurrence of parasitic capacitance in the inductor L1 more effectively. In the inductors L2 through L4 as well as in the inductor L1, the occurrence of parasitic capacitance is reduced for the same reason discussed above.

Figure 11:
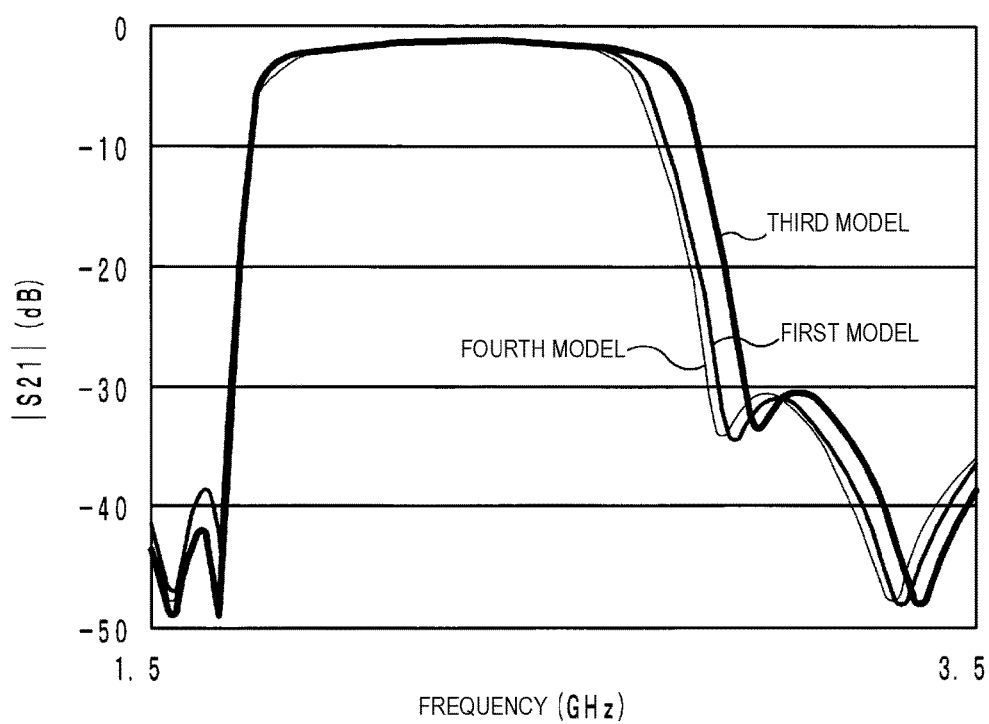
FIG. 11 is a graph illustrating bandpass characteristics of first, third, and fourth models.

For clarifying the advantages achieved by the electronic components 10a and 10b, the inventor of this application conducted the following computer simulations. A first model having the structure of the electronic component 10a and a third model having the structure of the electronic component 10b were created. An electronic component in which the entireties of the inductors L1 through L4 of the electronic component 10b were respectively positioned in planes S1 through S4 was created as a fourth model. The fourth model is a comparative example. The bandpass characteristics of the first, third, and fourth models were calculated. FIG. 11 is a graph illustrating the bandpass characteristics (S21) of the first, third, and fourth models. In FIG. 11, the vertical axis indicates |S21|, while the horizontal axis indicates the frequency.

FIG. 11 shows that the pass band of the third model is the widest and that of the fourth model is the narrowest. In the fourth model, neither of the inductor conductive layers nor the via-hole conductors is displaced from each other in the right-left direction. In the first model, only inductor conductive layers are displaced from each other in the right-left direction. In the third model, both of the inductor conductive layers and the via-hole conductors are displaced from each other in the right-left direction. Accordingly, the parasitic capacitance of the inductors of the fourth model is the greatest, while the parasitic capacitance of the inductors of the third model is the smallest. The simulations conducted in the second preferred embodiment show that, as the parasitic capacitance of the inductors is smaller, the band pass of electronic components is wider.

Third Preferred Embodiment

Figure 12:
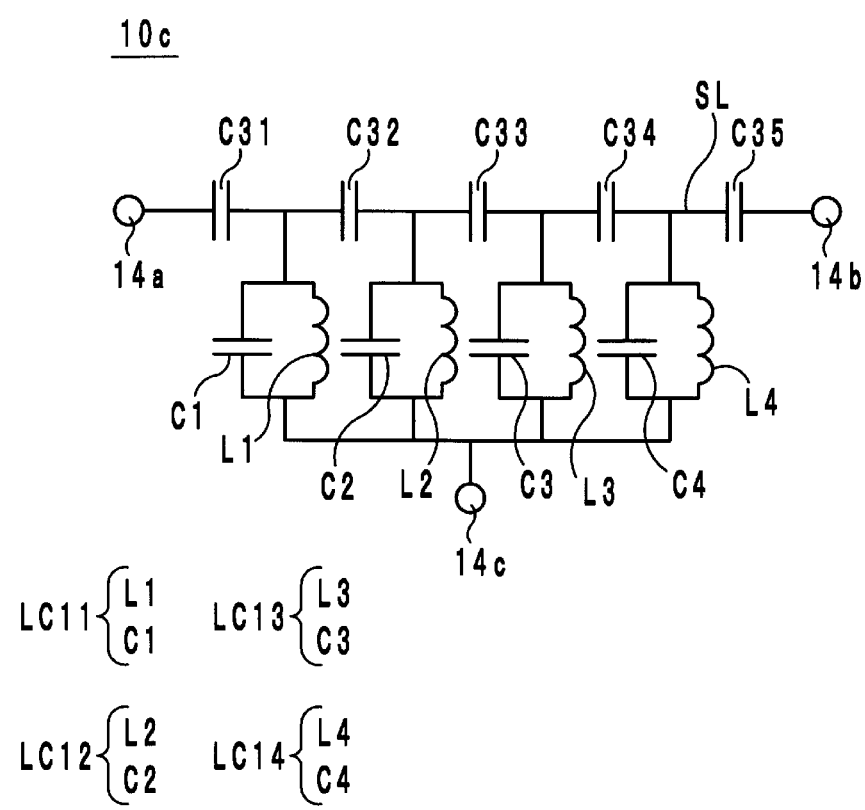
FIG. 12 is an equivalent circuit diagram of the electronic component according to the third preferred embodiment of the present invention.

An example of the circuit configuration of an electronic component 10c according to a third preferred embodiment of the present invention will first be described below with reference to the equivalent circuit diagram of FIG. 12.

The electronic component 10c differs from the electronic component 10a in that LC parallel resonators LC11 through LC14 are provided instead of the LC series resonators LC1 through LC4. The electronic component 10c is a band pass filter including outer electrodes 14a through 14c, inductors L1 through L4 and capacitors C1 through C4 and C31 through C35, as shown in FIG. 12.

The outer electrodes 14a and 14b are input/output terminals into and from which a radio-frequency signal is input and output. The outer electrode 14c is a ground terminal which is connected to a ground potential. The outer electrodes 14a and 14b are connected to each other by a signal path SL.

The capacitors C31 through C35 are disposed on the signal path SL and are electrically connected in series with each other in this order from the outer electrode 14a to the outer electrode 14b.

The inductor L1 and the capacitor C1 are electrically connected in parallel with each other between the signal path SL and the outer electrode 14c so as to define the LC parallel resonator LC11. In the third preferred embodiment, the inductor L1 and the capacitor C1 are electrically connected in parallel with each other between a node between the capacitors C31 and C32 and the outer electrode 14c. The resonant frequency of the LC parallel resonator LC11 is a frequency fa11.

The inductor L2 and the capacitor C2 are electrically connected in parallel with each other between the signal path SL and the outer electrode 14c so as to define the LC parallel resonator LC12. In the third preferred embodiment, the inductor L2 and the capacitor C2 are electrically connected in parallel with each other between a node between the capacitors C32 and C33 and the outer electrode 14c. The resonant frequency of the LC parallel resonator LC12 is a frequency fa12.

The inductor L3 and the capacitor C3 are electrically connected in parallel with each other between the signal path SL and the outer electrode 14c so as to define the LC parallel resonator LC13. In the third preferred embodiment, the inductor L3 and the capacitor C3 are electrically connected in parallel with each other between a node between the capacitors C33 and C34 and the outer electrode 14c. The resonant frequency of the LC parallel resonator LC13 is a frequency fa13.

The inductor L4 and the capacitor C4 are electrically connected in parallel with each other between the signal path SL and the outer electrode 14c so as to define the LC parallel resonator LC14. In the third preferred embodiment, the inductor L4 and the capacitor C4 are electrically connected in parallel with each other between a node between the capacitors C34 and C35 and the outer electrode 14c. The resonant frequency of the LC parallel resonator LC14 is a frequency fa14.

The resonant frequencies fa11 through fa14 are all different. The LC parallel resonators LC11 through LC14 define a band pass filter that allows radio-frequency signals in bands of fa11 through fa14 to pass through the band pass filter and transmits the radio-frequency signals from the outer electrode 14a to the outer electrode 14b.

Figure 13:
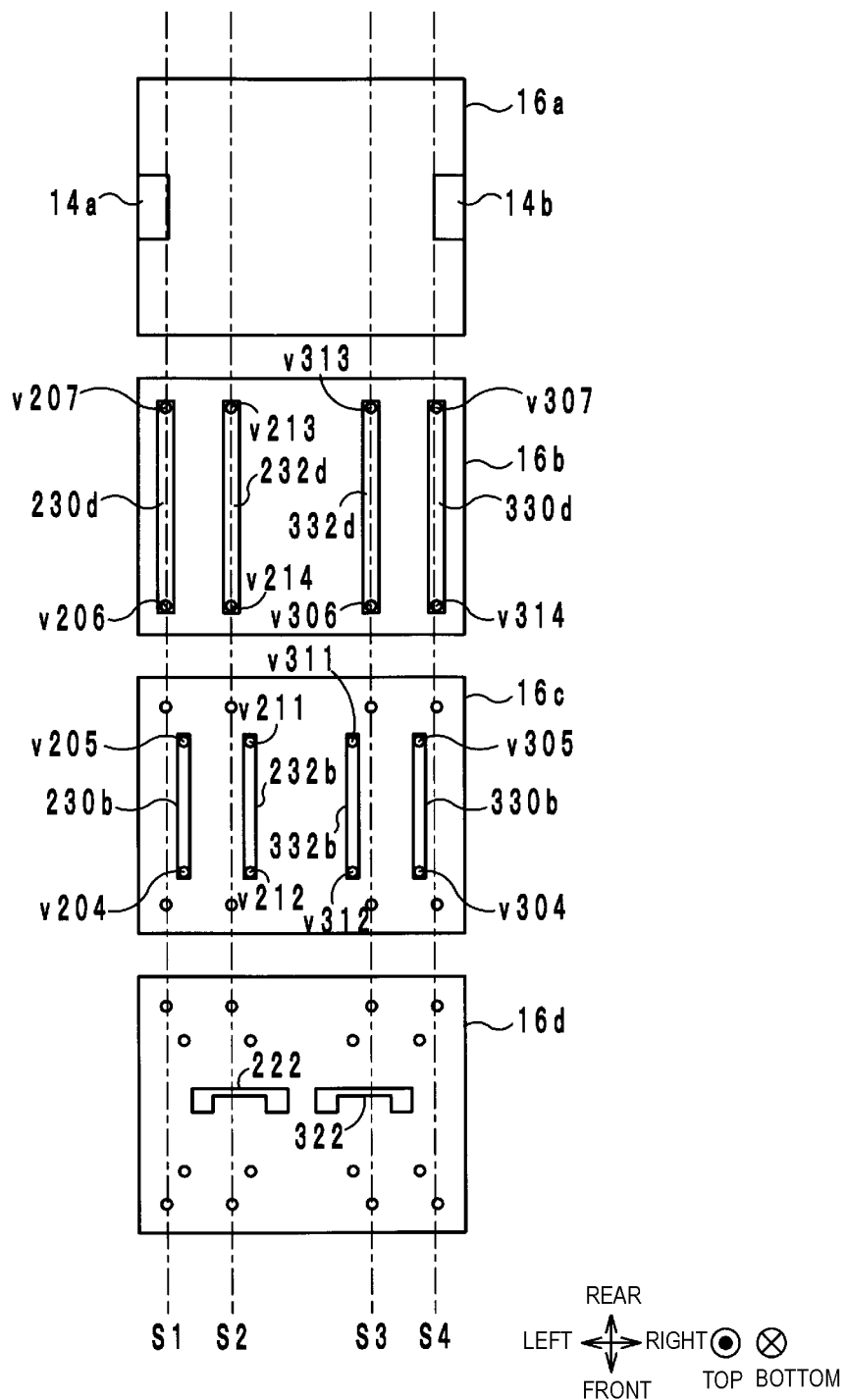
FIGS. 13 through 15 are exploded views of the electronic component according to the third preferred embodiment of the present invention.
Figure 14:
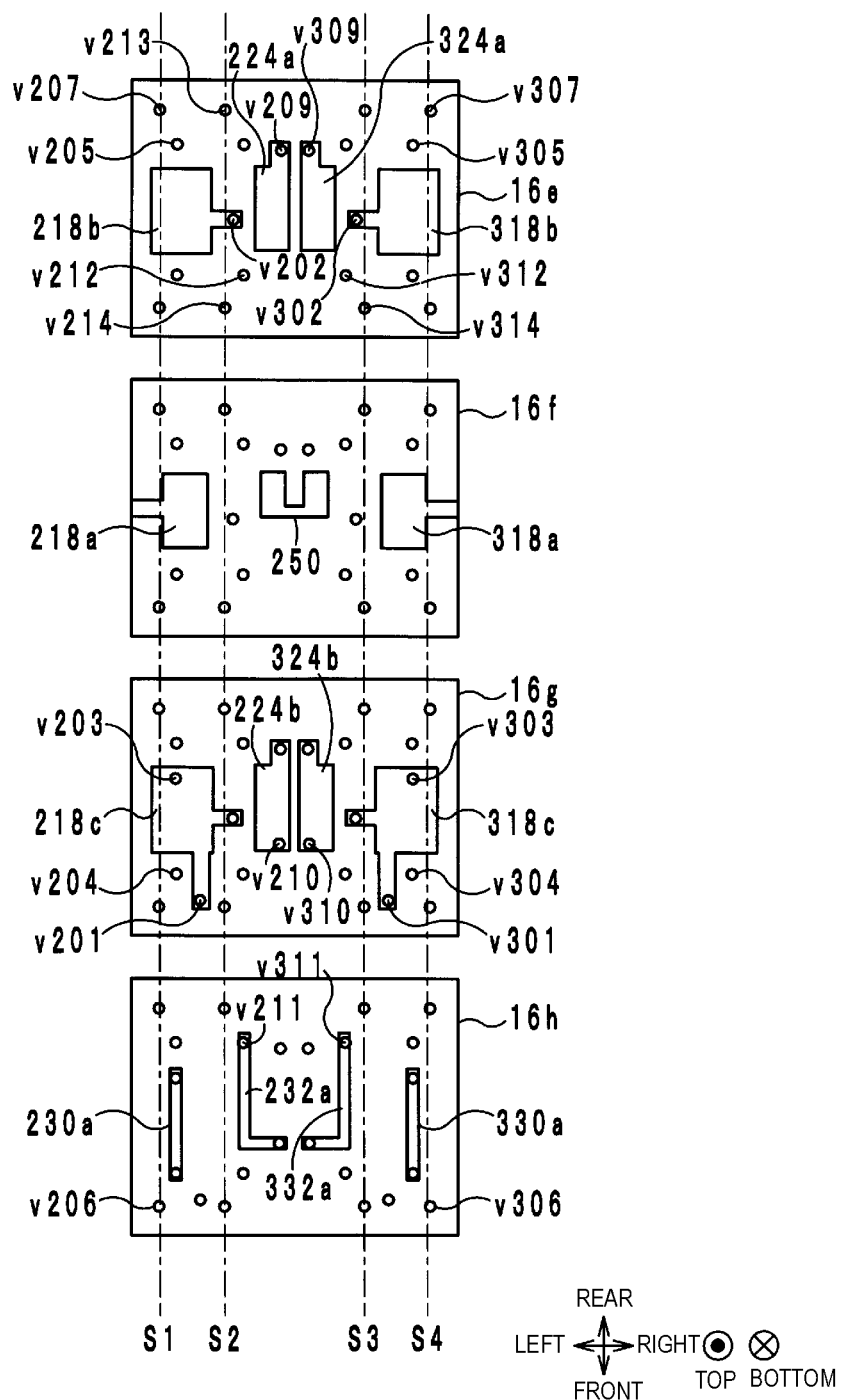
Figure 15:
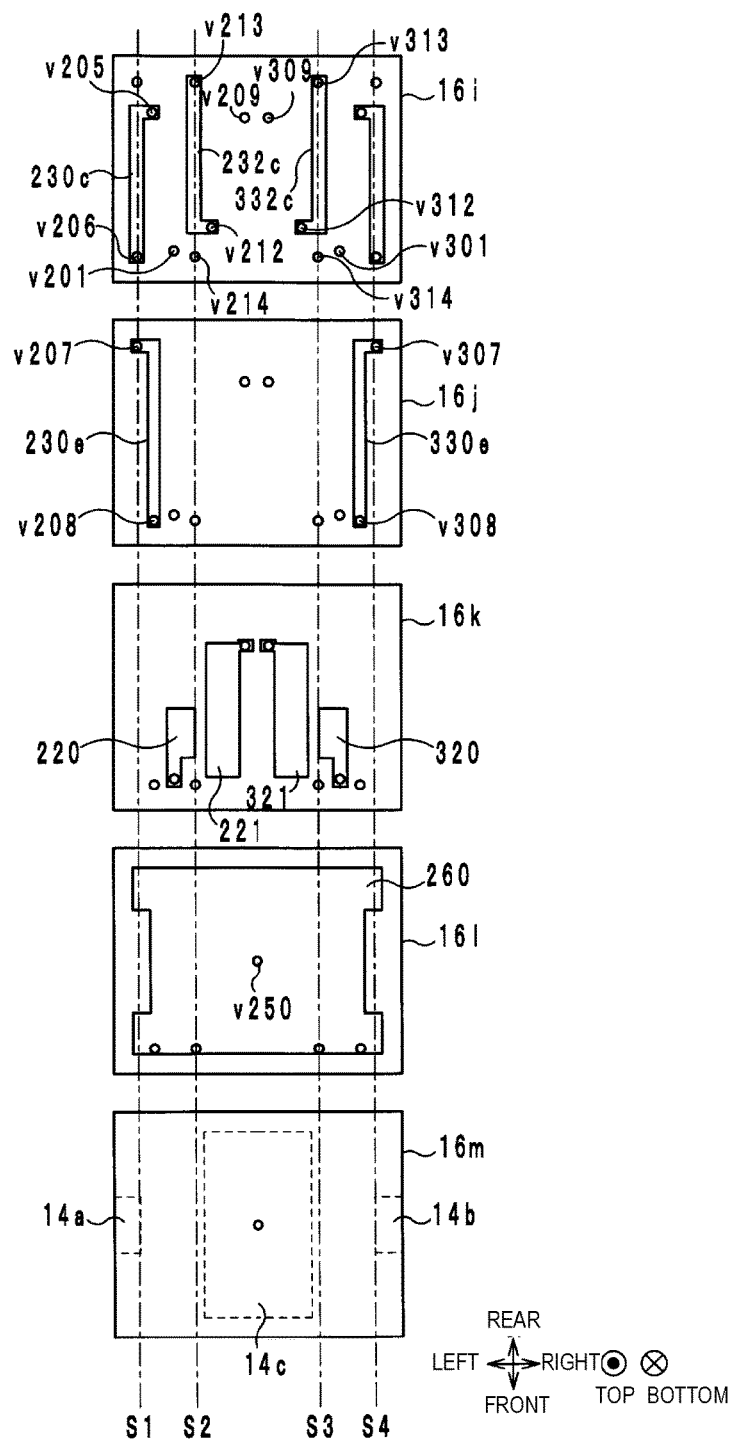

An example of the specific configuration of the electronic component 10c will now be described below with reference to the drawings. FIGS. 13 through 15 are exploded views of the electronic component 10c. FIG. 1B is used for explaining the external perspective view of the electronic component 10c since it is the same as that of the electronic component 10a.

As shown in FIGS. 13 through 15, the electronic component 10c includes a multilayer body 12, outer electrodes 14a through 14c, capacitor conductive layers 218a through 218c, 220, 221, 222, 224a, 224b, 250, 260, 318a through 318c, 320, 321, 322, 324a, and 324b, inductor conductive layers 230a through 230e, 232a through 232d, 330a through 330e, and 332a through 332d, and via-hole conductors v201 through v214 and v301 through v314.

The multilayer body 12 preferably has a rectangular or substantially rectangular parallelepiped shape, and includes insulating layers 16a through 16m stacked on each other in this order from the top side to the bottom side. The multilayer body 12 of the electronic component 10c is basically the same as that of the multilayer component 10a, and an explanation thereof will thus be omitted.

The outer electrodes 14a through 14c of the electronic component 10c are the same as those of the electronic component 10a, and an explanation thereof will thus be omitted.

The capacitor conductive layer 218a is a rectangular or substantially rectangular conductive layer disposed on the top surface of the insulating layer 16f. The capacitor conductive layer 218a is disposed in the left half region of the insulating layer 16f and is extended to the left side of the insulating layer 16f so as to be connected to the outer electrode 14a.

The capacitor conductive layer 218b is a rectangular or substantially rectangular conductive layer disposed on the top surface of the insulating layer 16e. The capacitor conductive layer 218b is disposed in the left half region of the insulating layer 16e. The capacitor conductive layer 218b is superposed on the capacitor conductive layer 218a, as viewed from above.

The capacitor conductive layer 218c is a rectangular or substantially rectangular conductive layer disposed on the top surface of the insulating layer 16g. The capacitor conductive layer 218c is disposed in the left half region of the insulating layer 16g. The capacitor conductive layer 218c is superposed on the capacitor conductive layer 218a, as viewed from above. With this configuration, the capacitor conductive layers 218a through 218c define the capacitor C31.

The capacitor conductive layer 220 is a rectangular or substantially rectangular conductive layer disposed on the top surface of the insulating layer 16k. The capacitor conductive layer 220 is disposed in the left half region of the insulating layer 16k.

The capacitor conductive layer 260 is a rectangular or substantially rectangular conductive layer disposed on the top surface of the insulating layer 16l. The capacitor conductive layer 260 covers substantially the entirety of the top surface of the insulating layer 16l and is superposed on the capacitor conductive layer 220, as viewed from above. With this configuration, the capacitor conductive layers 220 and 260 define the capacitor C1.

The via-hole conductor v201 passes through the insulating layers 16g through 16j in the top-bottom direction, and connects the capacitor conductive layers 218c and 220. With this configuration, the capacitors C31 and C1 are connected to each other.

The via-hole conductor v250 passes through the insulating layers 16l and 16m in the top-bottom direction, and connects the capacitor conductive layer 260 and the outer electrode 14c. With this configuration, the capacitor C1 is connected to the outer electrode 14c.

The inductor conductive layer 230a is a linear conductive layer disposed on the top surface of the insulating layer 16h and extending along the left side of the insulating layer 16h.

The via-hole conductor v203 passes through the insulating layer 16g in the top-bottom direction, and connects the rear end of the capacitor conductive layer 218c and the rear end of the inductor conductive layer 230a.

The inductor conductive layer 230b is a linear conductive layer disposed on the top surface of the insulating layer 16c and extending along the left side of the insulating layer 16c. The rear end of the inductor conductive layer 230b is located farther rearward than the rear end of the inductor conductive layer 230a, as viewed from above. The front end of the inductor conductive layer 230b is superposed on the front end of the inductor conductive layer 230a, as viewed from above.

The via-hole conductor v204 passes through the insulating layers 16c through 16g in the top-bottom direction, and connects the front end of the inductor conductive layer 230a and the front end of the inductor conductive layer 230b.

The inductor conductive layer 230c is a linear conductive layer disposed on the top surface of the insulating layer 16i and extending along the left side of the insulating layer 16i. The rear end of the inductor conductive layer 230c is bent toward the right side. The front end of the inductor conductive layer 230c is located farther frontward than the front end of the inductor conductive layer 230b, as viewed from above. The rear end of the inductor conductive layer 230c is superposed on the rear end of the inductor conductive layer 230b, as viewed from above.

The via-hole conductor v205 passes through the insulating layers 16c through 16h in the top-bottom direction, and connects the rear end of the inductor conductive layer 230b and the rear end of the inductor conductive layer 230c.

The inductor conductive layer 230d is a linear conductive layer disposed on the top surface of the insulating layer 16b and extending along the left side of the insulating layer 16b. The front end of the inductor conductive layer 230d is superposed on the front end of the inductor conductive layer 230c, as viewed from above. The rear end of the inductor conductive layer 230d is located farther rearward than the rear end of the inductor conductive layer 230c, as viewed from above.

The via-hole conductor v206 passes through the insulating layers 16b through 16h in the top-bottom direction, and connects the front end of the inductor conductive layer 230c and the front end of the inductor conductive layer 230d.

The inductor conductive layer 230e is a linear conductive layer disposed on the top surface of the insulating layer 16j and extending along the left side of the insulating layer 16j. The rear end of the inductor conductive layer 230e is bent toward the left side. The rear end of the inductor conductive layer 230e is superposed on the rear end of the inductor conductive layer 230d, as viewed from above.

The via-hole conductor v207 passes through the insulating layers 16b through 16i in the top-bottom direction, and connects the rear end of the inductor conductive layer 230d and the rear end of the inductor conductive layer 230e.

The inductor conductive layers 230a through 230e and the via-hole conductors v203 through v207 are connected to each other in the above-described manner so as to define the inductor L1. With the above-described configuration, the inductor L1 preferably has a helical or substantially helical shape, as viewed from the right-left direction (direction perpendicular or substantially perpendicular to the stacking direction). In the third preferred embodiment, the inductor L1 extends from inward to outward while turning counterclockwise, as viewed from the left side. Since the via-hole conductor v203 is connected to the capacitor conductive layer 218c, the inductor L1 is connected to the capacitor C31.

The inductor L1 includes the inductor conductive layer 230b positioned inward and the inductor conductive layer 230d positioned outward adjacent to each other. The inductor conductive layer 230b is located farther rightward than the inductor conductive layer 230d, as viewed from above. With this configuration, the inductor conductive layer 230b is displaced from the inductor conductive layer 230d toward the right side.

The inductor L1 includes the inductor conductive layer 230a positioned inward and the inductor conductive layer 230c positioned outward adjacent to each other. The inductor conductive layer 230a is located farther rightward than the inductor conductive layer 230c, as viewed from above. With this configuration, the inductor conductive layer 230a is displaced from the inductor conductive layer 230c toward the right side.

The inductor L1 includes the inductor conductive layer 230c positioned outward and the inductor conductive layer 230e positioned inward adjacent to each other. The inductor conductive layer 230c is located farther leftward than the inductor conductive layer 230e, as viewed from above. With this configuration, the inductor conductive layer 230c is displaced from the inductor conductive layer 230e toward the left side.

In the inductor L1 configured as described above, a certain portion of the inductor L1 is located on a plane S1 perpendicular or substantially perpendicular to the right-left direction, and the remaining portion of the inductor L1 is located farther rightward than the plane S1. More specifically, the inductor conductive layers 230c and 230d and the via-hole conductors v206 and v207 of the inductor L1 are located on the plane S1, while the inductor conductive layers 230a, 230b, and 230e and the via-hole conductors v204 and v205 are located farther rightward than the plane S1.

The via-hole conductor v208 passes through the insulating layers 16j and 16k in the top-bottom direction, and connects the front end of the inductor conductive layer 230e and the capacitor conductive layer 260. Since the capacitor conductive layer 260 is connected to the outer electrode 14c by using the via-hole conductor v250, the inductor L1 is connected to the outer electrode 14c.

The capacitor conductive layer 224a is a rectangular or substantially rectangular conductive layer disposed on the top surface of the insulating layer 16e. The capacitor conductive layer 224a is located farther leftward than the center (intersection of diagonal lines) of the insulating layer 16e.

The capacitor conductive layer 224b is a rectangular or substantially rectangular conductive layer disposed on the top surface of the insulating layer 16g. The capacitor conductive layer 224b is located farther leftward than the center (intersection of diagonal lines) of the insulating layer 16g. The capacitor conductive layers 224a and 224b are superposed on each other such that they coincide with each other, as viewed from above.

The capacitor conductive layer 222 is a rectangular or substantially rectangular conductive layer disposed on the top surface of the insulating layer 16d. The capacitor conductive layer 222 extends in the right-left direction substantially at the center of the insulating layer 16d in the front-rear direction. The capacitor conductive layer 222 overlaps the capacitor conductive layers 218b and 224a, as viewed from above. With this configuration, the capacitor conductive layers 218b, 222, and 224a define the capacitor C32.

The capacitor conductive layer 221 is a rectangular or substantially rectangular conductive layer disposed on the top surface of the insulating layer 16k. The capacitor conductive layer 221 is located farther leftward than the center (intersection of diagonal lines) of the insulating layer 16k. The capacitor conductive layer 221 opposes the capacitor conductive layer 260, as viewed from above. With this configuration, the capacitor conductive layers 221 and 260 define the capacitor C2. Since the capacitor conductive layer 260 is connected to the outer electrode 14c by using the via-hole conductor v250, the capacitor C2 is connected to the outer electrode 14c.

The via-hole conductor v209 passes through the insulating layers 16e through 16j in the top-bottom direction, and connects the capacitor conductive layers 224a and 224b to the capacitor conductive layer 221. With this configuration, the capacitors C32 and C2 are connected to each other.

The inductor conductive layer 232a is a linear conductive layer disposed on the top surface of the insulating layer 16h and extending in the front-rear direction at the left side of the center (intersection of diagonal lines) of the insulating layer 16h. The front end of the inductor conductive layer 232a is bent toward the right side.

The via-hole conductor v210 passes through the insulating layer 16g in the top-bottom direction, and connects the front end of the capacitor conductive layer 224b and the front end of the inductor conductive layer 232a.

The inductor conductive layer 232b is a linear conductive layer disposed on the top surface of the insulating layer 16c and extending in the front-rear direction at the left side of the center (intersection of diagonal lines) of the insulating layer 16c. The rear end of the inductor conductive layer 232b is superposed on the rear end of the inductor conductive layer 232a, as viewed from above. The front end of the inductor conductive layer 232b is located farther frontward than the front end of the inductor conductive layer 232a, as viewed from above.

The via-hole conductor v211 passes through the insulating layers 16c through 16g in the top-bottom direction, and connects the rear end of the inductor conductive layer 232a and the rear end of the inductor conductive layer 232b.

The inductor conductive layer 232c is a linear conductive layer disposed on the top surface of the insulating layer 16i and extending in the front-rear direction at the left side of the center (intersection of diagonal lines) of the insulating layer 16i. The front end of the inductor conductive layer 232c is bent toward the right side. With this configuration, the front end of the inductor conductive layer 232c is superposed on the front end of the inductor conductive layer 232b, as viewed from above. The rear end of the inductor conductive layer 232c is located farther rearward than the rear end of the inductor conductive layer 232b, as viewed from above.

The via-hole conductor v212 passes through the insulating layers 16c through 16h in the top-bottom direction, and connects the front end of the inductor conductive layer 232b and the front end of the inductor conductive layer 232c.

The inductor conductive layer 232d is a linear conductive layer disposed on the top surface of the insulating layer 16b and extending in the front-rear direction at the left side of the center (intersection of diagonal lines) of the insulating layer 16b. The rear end of the inductor conductive layer 232d is superposed on the rear end of the inductor conductive layer 232c, as viewed from above. The front end of the inductor conductive layer 232d is located farther frontward than the front end of the inductor conductive layer 232c, as viewed from above.

The via-hole conductor v213 passes through the insulating layers 16b through 16h in the top-bottom direction, and connects the rear end of the inductor conductive layer 232c and the rear end of the inductor conductive layer 232d.

The via-hole conductor v214 passes through the insulating layers 16b through 16k in the top-bottom direction, and connects the front end of the inductor conductive layer 232d and the capacitor conductive layer 260.

The inductor conductive layers 232a through 232d and the via-hole conductors v210 through v214 are connected to each other in the above-described manner so as to define the inductor L2. With the above-described configuration, the inductor L2 preferably has a helical or substantially helical shape, as viewed from the right-left direction (direction perpendicular or substantially perpendicular to the stacking direction). In the third preferred embodiment, the inductor L2 extends from inward to outward while turning clockwise, as viewed from the left side. Since the via-hole conductor v210 is connected to the capacitor conductive layer 224b, the inductor L2 is connected to the capacitor C32. Since the via-hole conductor v250 connects the capacitor conductive layer 260 and the outer electrode 14c, the inductor L2 is connected to the outer electrode 14c.

The inductor L2 includes the inductor conductive layer 232b positioned inward and the inductor conductive layer 232d positioned outward adjacent to each other. The inductor conductive layer 232b is located farther rightward than the inductor conductive layer 232d, as viewed from above. With this configuration, the inductor conductive layer 232b is displaced from the inductor conductive layer 232d toward the right side.

The inductor L2 includes the inductor conductive layer 232a positioned inward and the inductor conductive layer 232c positioned outward adjacent to each other. The inductor conductive layer 232a is located farther rightward than the inductor conductive layer 232c, as viewed from above. With this configuration, the inductor conductive layer 232a is displaced from the inductor conductive layer 232c toward the right side.

In the inductor L2 configured as described above, a certain portion of the inductor L2 is located on a plane S2 perpendicular or substantially perpendicular to the right-left direction, and the remaining portion of the inductor L2 is located farther rightward than the plane S2. More specifically, the inductor conductive layers 232c and 232d and the via-hole conductors v213 and v214 of the inductor L2 are located on the plane S2, while the inductor conductive layers 232a and 232b and the via-hole conductors v211 and v212 are located farther rightward than the plane S2.

The capacitor conductive layers 318a through 318c, 320, 321, 322, 324a, and 324b, the inductor conductive layers 330a through 330e and 332a through 332d, and the via-hole conductors v301 through v314 are respectively line-symmetrical to the capacitor conductive layers 218a through 218c, 220, 221, 222, 224a, and 224b, the inductor conductive layers 230a through 230e and 232a through 232d, and the via-hole conductors v201 through v214 with respect to a straight line passing through the front-rear direction at the center of the top surface of the multilayer body 12, as viewed from above. Accordingly, an explanation of the capacitor conductive layers 318a through 318c, 320, 321, 322, 324a, and 324b, the inductor conductive layers 330a through 330e and 332a through 332d, and the via-hole conductors v301 through v314 will be omitted.

The capacitor conductive layer 250 is disposed on the top surface of the insulating layer 16f, and includes two rectangular or substantially rectangular conductive layers and one linear conductive layer. One rectangular or substantially rectangular conductive layer overlaps the capacitor conductive layers 224a and 224b, as viewed from above. The other rectangular or substantially rectangular conductive layer overlaps the capacitor conductive layers 324a and 324b, as viewed from above. The linear conductive layer connects the two rectangular or substantially rectangular conductive layers. With this configuration, the capacitor conductive layers 224a, 224b, 250, 324a, and 324b define the capacitor C33.

By using the electronic component 10c configured as described above, it is possible to significantly reduce or prevent the occurrence of parasitic capacitance in the inductors L1 through L4, as in the electronic component 10a.

Figure 16:
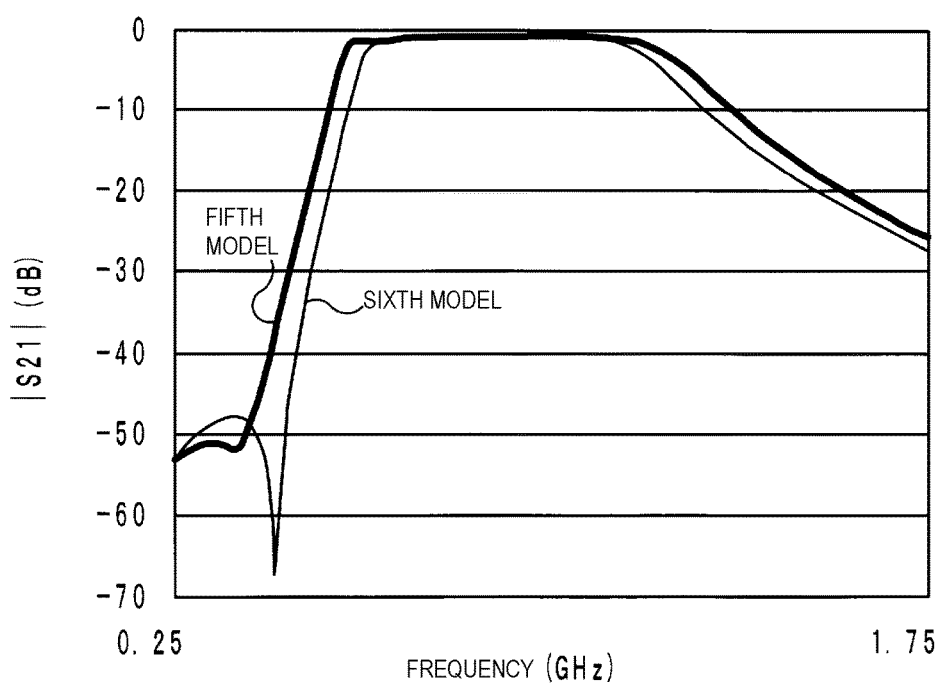
FIG. 16 is a graph illustrating bandpass characteristics of fifth and sixth models.

For clarifying the advantages achieved by the electronic component 10c, the inventor of this application conducted the following computer simulations. A fifth model having the structure of the electronic component 10c was created. An electronic component in which the entireties of the inductors L1 through L4 of the electronic component 10c were respectively positioned in planes S1 through S4 was created as a sixth model. The sixth model is a comparative example. The bandpass characteristics of the fifth and sixth models were calculated. FIG. 16 is a graph illustrating the bandpass characteristics (S21) of the fifth and sixth models. In FIG. 16, the vertical axis indicates |S21|, while the horizontal axis indicates the frequency.

FIG. 16 shows that the pass band of the fifth model is wider than that of the sixth model. The reason for this is that the frequencies fa11 through fa14 of the LC parallel resonators LC11 through LC14 are maintained due to a reduction in the parasitic capacitance of the inductors L1 through L4.

Fourth Preferred Embodiment

Figure 17:
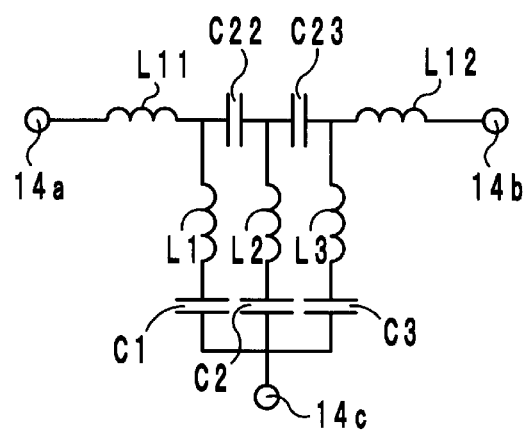
FIG. 17 is an equivalent circuit diagram of the electronic component according to the fourth preferred embodiment of the present invention.

An example of the circuit configuration of an electronic component 10d according to a fourth preferred embodiment of the present invention will first be described below with reference to the equivalent circuit diagram of FIG. 17.

The electronic component 10d, as well as the electronic component 10a, is a band pass filter. The electronic component 10d differs from the electronic component 10a in that the inductor L4 and the capacitors C4, C11, C12, C21, C24, and C25 are not provided. The circuit configuration of the other portions is the same as that of the electronic component 10a, and an explanation thereof will thus be omitted.

Figure 18:
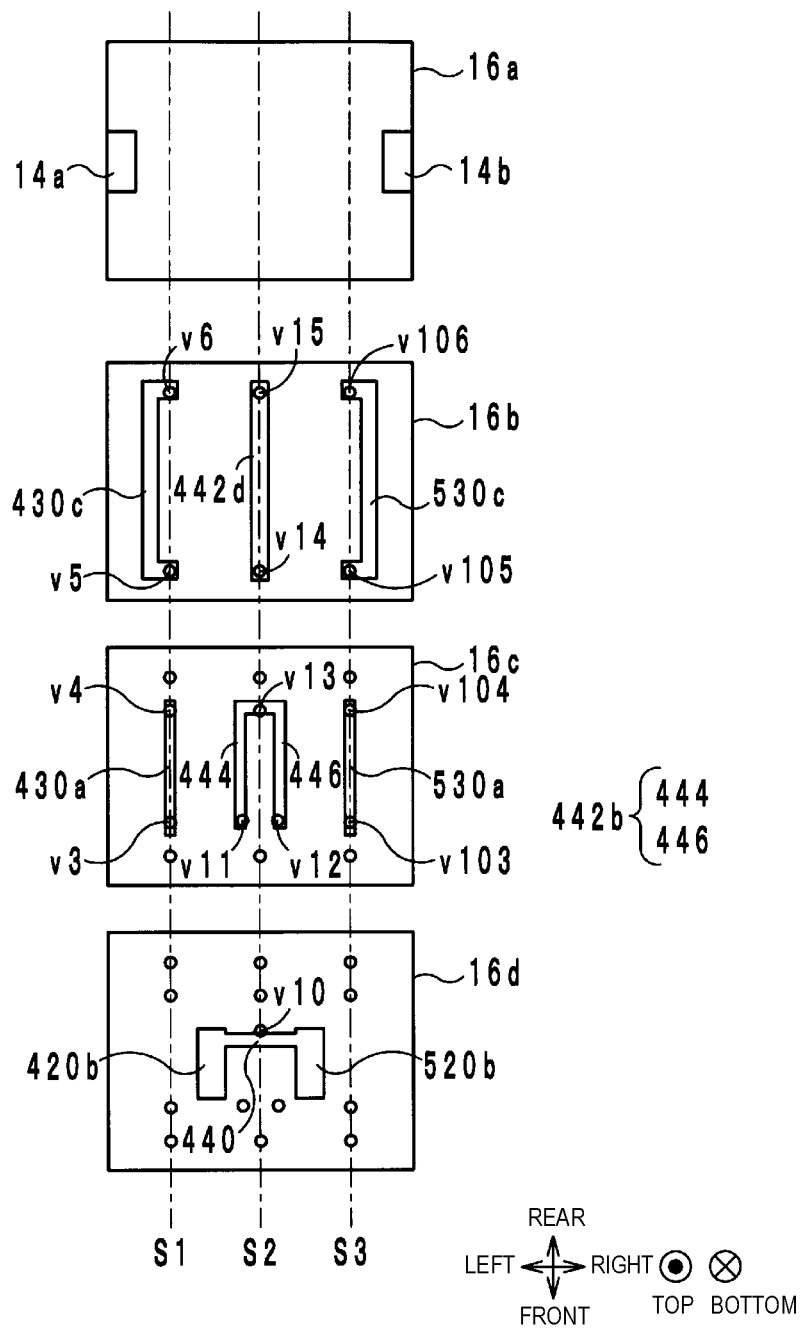
FIGS. 18 through 20 are exploded views of the electronic component according to the fourth preferred embodiment of the present invention.
Figure 19:
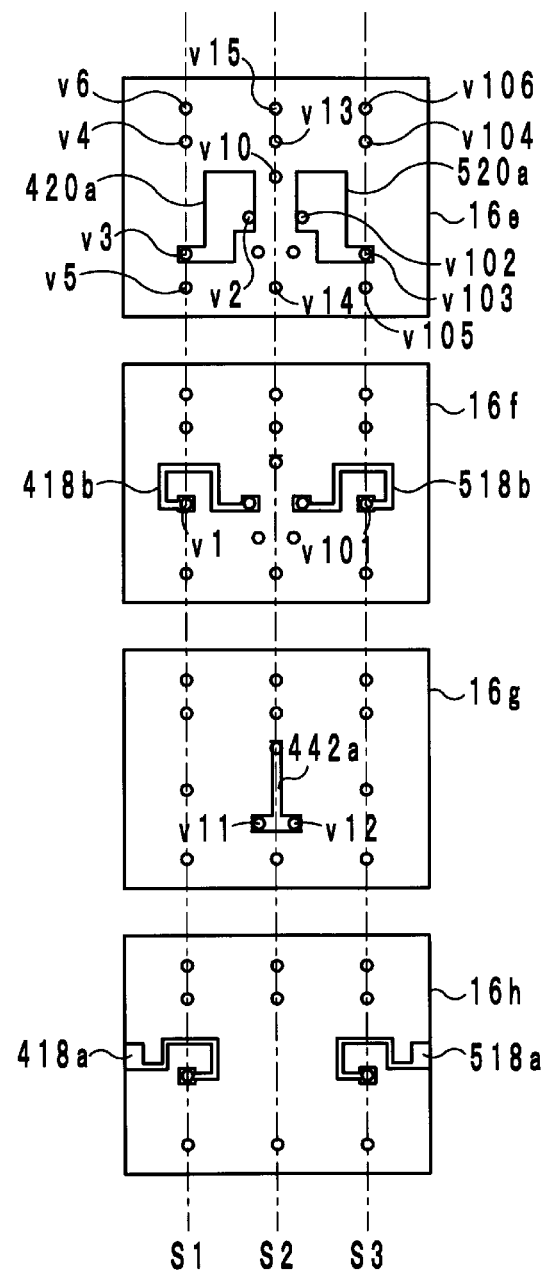
Figure 20:
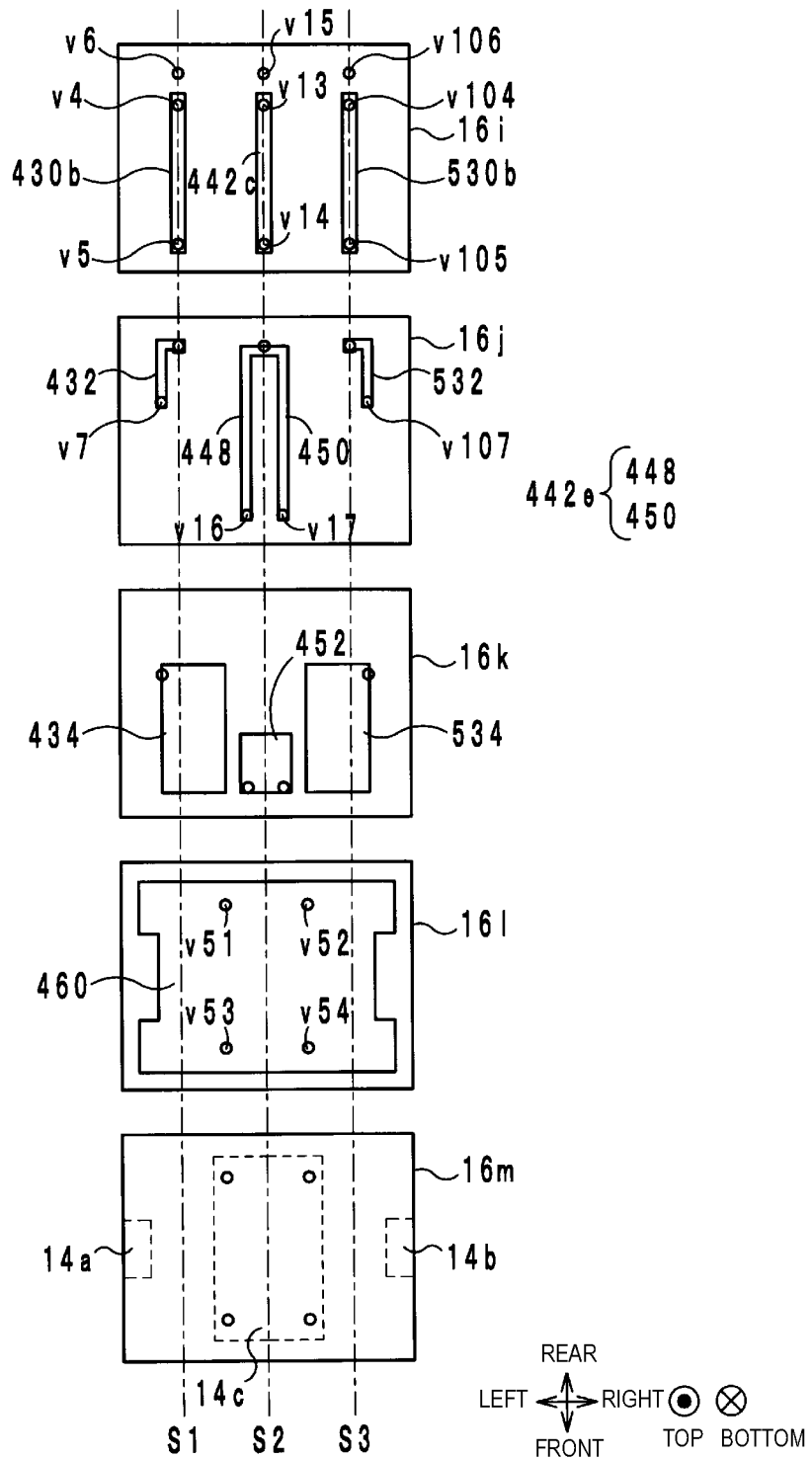

An example of the specific configuration of the electronic component 10d will now be described below with reference to the drawings. FIGS. 18 through 20 are exploded views of the electronic component 10d. The stacking direction of a multilayer body 12 of the electronic component 10d is defined as the top-bottom direction. The longitudinal direction of the top surface of the electronic component 10d, as viewed from above, is defined as the right-left direction, and the widthwise direction of the top surface of the electronic component 10d, as viewed from above, is defined as the front-rear direction. FIG. 1B is used for explaining the external perspective view of the electronic component 10d since it is the same as that of the electronic component 10a.

As shown in FIGS. 1B and 18 through 20, the electronic component 10d includes a multilayer body 12, outer electrodes 14a through 14c, inductor conductive layers 418a, 418b, 430a through 430c, 442a through 442e, 518a, 518b, and 530a through 530c, capacitor conductive layers 420a, 420b, 434, 452, 460, 520a, 520b, and 534, connecting conductive layers 432, 440, and 532, and via-hole conductors v1 through v7, v10 through v17, v51 through v54, and v101 through v107.

The multilayer body 12 preferably has a rectangular or substantially rectangular parallelepiped shape, and includes insulating layers 16a through 16m stacked on each other in this order from the top side to the bottom side. The multilayer body 12 of the electronic component 10d is basically the same as that of the multilayer component 10a, and an explanation thereof will thus be omitted.

The outer electrodes 14a through 14c of the electronic component 10d are the same as those of the electronic component 10a, and an explanation thereof will thus be omitted.

The inductor conductive layer 418a is a linear conductive layer disposed on the top surface of the insulating layer 16h. The inductor conductive layer 418a extends from the center of the left side of the insulating layer 16h as a start point to the center of the left half region of the insulating layer 16h as an end point. The inductor conductive layer 418a turns from the start point to the end point clockwise. The inductor conductive layer 418a is connected to the outer electrode 14a.

The inductor conductive layer 418b is a linear conductive layer disposed on the top surface of the insulating layer 16f. The inductor conductive layer 418b extends from the center of the left half region of the insulating layer 16f as a start point to a point positioned on the right side of the start point as an end point. The inductor conductive layer 418b turns from the start point to the end point clockwise.

The via-hole conductor v1 passes through the insulating layers 16f and 16g in the top-bottom direction, and connects the end point of the inductor conductive layer 418a and the start point of the inductor conductive layer 418b. With this configuration, the inductor conductive layers 418a and 418b and the via-hole conductor v1 define the inductor L11 preferably having a helical or substantially helical shape.

The capacitor conductive layer 420a is disposed on the top surface of the insulating layer 16e, and includes a rectangular or substantially rectangular conductive layer and one linear conductive layer. The capacitor conductive layer 420a is disposed in the left half region of the insulating layer 16e. The linear conductive layer extends from the left side of the rectangular or substantially rectangular conductive layer toward the left side.

The capacitor conductive layer 420b is a rectangular or substantially rectangular conductive layer disposed on the top surface of the insulating layer 16d. The capacitor conductive layer 420b is disposed in the left half region of the insulating layer 16d, and overlaps the capacitor conductive layer 420a, as viewed from above. With this configuration, the capacitor conductive layers 420a and 420b define the capacitor C22.

The via-hole conductor v2 passes through the insulating layer 16e in the top-bottom direction, and connects the end point of the inductor conductive layer 418b and the capacitor conductive layer 420a. With this configuration, the inductor L11 and the capacitor C22 are electrically connected in series with each other.

The inductor conductive layer 430a is a linear conductive layer disposed on the top surface of the insulating layer 16c and extending along the left side of the insulating layer 16c. The front and rear ends of the inductor conductive layer 430a are not bent toward the left side.

The via-hole conductor v3 passes through the insulating layers 16c through 16e in the top-bottom direction, and connects the left end of the capacitor conductive layer 420a and the front end of the inductor conductive layer 430a.

The inductor conductive layer 430b is a linear conductive layer disposed on the top surface of the insulating layer 16i and extending along the left side of the insulating layer 16i. The front and rear ends of the inductor conductive layer 430b are not bent toward the left side. With this configuration, the inductor conductive layer 430b is superposed on the inductor conductive layer 430a, as viewed from above. The front end of the inductor conductive layer 430b is located farther frontward than the front end of the inductor conductive layer 430a, as viewed from above. The rear end of the inductor conductive layer 430b is superposed on the rear end of the inductor conductive layer 430a, as viewed from above.

The via-hole conductor v4 passes through the insulating layers 16c through 16h in the top-bottom direction, and connects the rear end of the inductor conductive layer 430a and the rear end of the inductor conductive layer 430b.

The inductor conductive layer 430c is a linear conductive layer disposed on the top surface of the insulating layer 16b and extending along the left side of the insulating layer 16b. The front and rear ends of the inductor conductive layer 430c are bent toward the right side. The inductor conductive layer 430c preferably has an angular U-shape or substantially angular U-shape structure opened on the right side. With this configuration, the inductor conductive layer 430c is not superposed on the inductor conductive layer 430a, as viewed from above. The front end of the inductor conductive layer 430c is superposed on the front end of the inductor conductive layer 430b, as viewed from above, but none of the other portions of the inductor conductive layer 430c are superposed on the inductor conductive layer 430b, as viewed from above. The rear end of the inductor conductive layer 430c is located farther rearward than the rear end of the inductor conductive layer 430b, as viewed from above.

The via-hole conductor v5 passes through the insulating layers 16b through 16h in the top-bottom direction, and connects the front end of the inductor conductive layer 430b and the front end of the inductor conductive layer 430c.

The via-hole conductor v6 passes through the insulating layers 16b through 16i in the top-bottom direction. The top end of the via-hole conductor v6 is connected to the rear end of the inductor conductive layer 430c.

The inductor conductive layers 430a through 430c and the via-hole conductors v3 through v6 are connected to each other in the above-described manner so as to define the inductor L1. With the above-described configuration, the inductor L1 preferably has a helical or substantially helical shape, as viewed from the right-left direction (direction perpendicular or substantially perpendicular to the stacking direction). In the fourth preferred embodiment, the inductor L1 extends from inward to outward while turning counter-clockwise, as viewed from the left side. Since the via-hole conductor v3 is connected to the capacitor conductive layer 420a, the inductor L1 is connected to the capacitor C22.

The inductor L1 includes the inductor conductive layer 430a positioned inward and the inductor conductive layer 430c positioned outward adjacent to each other. The inductor conductive layer 430c is located farther leftward than the inductor conductive layer 430a, as viewed from above. With this configuration, the inductor conductive layer 430c is displaced from the inductor conductive layer 430a toward the left side.

In the inductor L1 configured as described above, a certain portion of the inductor L1 is located on a plane S1 perpendicular or substantially perpendicular to the right-left direction, and the remaining portion of the inductor L1 is located farther leftward than the plane S1. More specifically, both ends of the inductor conductive layer 430c, the inductor conductive layers 430a and 430b, and the via-hole conductors v3 through v6 of the inductor L1 are located on the plane S1, and portions of the inductor conductive layer 430c other than both ends thereof are located farther leftward than the plane S1.

The capacitor conductive layer 434 is a rectangular or substantially rectangular conductive layer disposed on the top surface of the insulating layer 16k. The capacitor conductive layer 434 is disposed in the left half region of the insulating layer 16k.

The capacitor conductive layer 460 is a rectangular or substantially rectangular conductive layer disposed on the top surface of the insulating layer 16l. The capacitor conductive layer 460 covers substantially the entirety of the top surface of the insulating layer 16l and is superposed on the capacitor conductive layer 434, as viewed from above. With this configuration, the capacitor conductive layers 434 and 460 define the capacitor C1.

The connecting conductive layer 432 is a linear conductive layer disposed on the top surface of the insulating layer 16j and extending along the left side of the insulating layer 16j. The bottom end of the via-hole conductor v6 is connected to the rear end of the connecting conductive layer 432.

The via-hole conductor v7 passes through the insulating layer 16j in the top-bottom direction, and connects the front end of the connecting conductive layer 432 and the capacitor conductive layer 434. With this configuration, the inductor L1 and the capacitor C1 are electrically connected in series with each other.

The via-hole conductors v51 through v54 pass through the insulating layers 16l and 16m in the top-bottom direction, and connect the capacitor conductive layer 460 and the outer electrode 14c. With this configuration, the capacitor C1 and the outer electrode 14c are connected to each other.

The inductor conductive layers 518a, 518b, and 530a through 530c, the capacitor conductive layers 520a, 520b, and 534, the connecting conductive layer 532, and the via-hole conductors v101 through v107 are respectively line-symmetrical to the inductor conductive layers 418a, 418b, and 430a through 430c, the capacitor conductive layers 420a, 420b, and 434, the connecting conductive layer 432, and the via-hole conductors v1 through v7 with respect to a straight line passing through the front-rear direction at the center of the top surface of the multilayer body 12, as viewed from above. Accordingly, an explanation of the inductor conductive layers 518a, 518b, and 530a through 530c, the capacitor conductive layers 520a, 520b, and 534, the connecting conductive layer 532, and the via-hole conductors v101 through v107 will be omitted.

The connecting conductive layer 440 is a linear conductive layer disposed on the top surface of the insulating layer 16d and extending in the right-left direction. The connecting conductive layer 440 connects the capacitor conductive layers 420b and 520b. With this configuration, the capacitors C22 and C23 are electrically connected in series with each other.

The inductor conductive layer 442a is a linear conductive layer disposed on the top surface of the insulating layer 16g and preferably has a T-shaped or substantially T-shaped structure. The inductor conductive layer 442a includes two linear conductive layers. One linear conductive layer is connected to the front end of the other linear conductive layer and extends in the right-left direction. The other linear conductive layer extends in the front-rear direction at or substantially at the center of the insulating layer 16g in the right-left direction.

The inductor conductive layer 442b is a linear conductive layer disposed on the top surface of the insulating layer 16c and extending in the front-rear direction between the inductor conductive layers 430a and 530a. The inductor conductive layer 442b includes linear conductive layers 444 and 446. The linear conductive layer 444 extends in the front-rear direction at the left side of the center (intersection of diagonal lines) of the insulating layer 16c. The linear conductive layer 446 extends in the front-rear direction at the right side of the center (intersection of diagonal lines) of the insulating layer 16c. The rear end of the linear conductive layer 444 and that of the linear conductive layer 446 are connected to each other. The front ends of the linear conductive layers 444 and 446 are superposed on both ends of the linear conductive layer of the inductor conductive layer 442a extending in the right-left direction, as viewed from above. The rear ends of the linear conductive layers 444 and 446 are located farther rearward than the rear end of the inductor conductive layer 442a, as viewed from above.

The via-hole conductor v11 passes through the insulating layers 16c through 16f in the top-bottom direction, and connects the front end of the linear conductive layer 444 and the inductor conductive layer 442a. The via-hole conductor v12 passes through the insulating layers 16c through 16f in the top-bottom direction, and connects the front end of the linear conductive layer 446 and the inductor conductive layer 442a.

The inductor conductive layer 442c is a linear conductive layer disposed on the top surface of the insulating layer 16i and extending in the front-rear direction between the inductor conductive layers 430b and 530b. In the fourth preferred embodiment, the inductor conductive layer 442c extends in the front-rear direction at or substantially at the center of the insulating layer 16i in the right-left direction. Accordingly, the inductor conductive layer 442c is not superposed on the portions of the linear conductive layers 444 and 446 other than the rear ends thereof, and is located between the linear conductive layers 444 and 446, as viewed from above. The front end of the inductor conductive layer 442c is located farther frontward than the front ends of the linear conductive layers 444 and 446, as viewed from above. The rear end of the inductor conductive layer 442c is superposed on the rear ends of the linear conductive layers 444 and 446, as viewed from above.

The via-hole conductor v13 passes through the insulating layers 16c through 16h in the top-bottom direction, and connects the rear ends of the linear conductive layers 444 and 446 and the rear end of the inductor conductive layer 442c.

The inductor conductive layer 442d is a linear conductive layer disposed on the top surface of the insulating layer 16b and extending in the front-rear direction between the inductor conductive layers 430c and 530c. The front end of the inductor conductive layer 442d is superposed on the front end of the linear conductive layer 442c, as viewed from above. The rear end of the inductor conductive layer 442d is located farther rearward than the rear end of the linear conductive layer 442c, as viewed from above.

The via-hole conductor v14 passes through the insulating layers 16b through 16h in the top-bottom direction, and connects the front end of the inductor conductive layer 442c and the front end of the inductor conductive layer 442d.

The inductor conductive layer 442e is a linear conductive layer disposed on the top surface of the insulating layer 16j and extending in the front-rear direction between the connecting conductive layers 432 and 532. The inductor conductive layer 442e includes linear conductive layers 448 and 450. The linear conductive layer 448 extends in the front-rear direction at the left side of the center (intersection of diagonal lines) of the insulating layer 16j. The linear conductive layer 450 extends in the front-rear direction at the right side of the center (intersection of diagonal lines) of the insulating layer 16j. With this configuration, the inductor conductive layer 442c is not superposed on the linear conductive layers 448 and 450 but is positioned therebetween. The rear end of the linear conductive layer 448 and that of the linear conductive layer 450 are connected to each other. The rear ends of the linear conductive layers 448 and 450 are superposed on the rear end of the inductor conductive layer 442d, as viewed from above.

The via-hole conductor v15 passes through the insulating layers 16b through 16i in the top-bottom direction, and connects the rear ends of the linear conductive layers 448 and 450 and the rear end of the inductor conductive layer 442d.

The inductor conductive layers 442a through 442e and the via-hole conductors v10 through v15 are connected to each other in the above-described manner so as to define the inductor L2. With the above-described configuration, the inductor L2 preferably has a helical or substantially helical shape, as viewed from the right-left direction (direction perpendicular or substantially perpendicular to the stacking direction). In the fourth preferred embodiment, the inductor L2 extends from inward to outward while turning counterclockwise, as viewed from the left side.

The inductor L2 includes the inductor conductive layer 442d positioned inward and the inductor conductive layer 442b positioned outward adjacent to each other. The rear ends of the linear conductive layers 444 and 446 are superposed on the inductor conductive layer 442d, as viewed from above. The portion of the linear conductive layer 444 other than the rear end thereof is located farther leftward than the inductor conductive layer 442d, as viewed from above. The portion of the linear conductive layer 446 other than the rear end thereof is located farther rightward than the inductor conductive layer 442d, as viewed from above. With this configuration, at least a portion of the inductor conductive layer 442b is displaced from the inductor conductive layer 442d toward both of the right side and the left side.

The inductor L2 includes the inductor conductive layer 442c positioned inward and the inductor conductive layer 442e positioned outward adjacent to each other. The linear conductive layer 448 is located farther leftward than the inductor conductive layer 442c, as viewed from above. The linear conductive layer 450 is located farther rightward than the inductor conductive layer 442c, as viewed from above. With this configuration, at least part of the inductor conductive layer 442e is displaced from the inductor conductive layer 442c toward both of the right side and the left side.

The capacitor conductive layer 452 is a rectangular or substantially rectangular conductive layer disposed on the top surface of the insulating layer 16k. The capacitor conductive layer 452 is provided between the capacitor conductive layers 434 and 534 and is superposed on the capacitor conductive layer 460, as viewed from above. With this configuration, the capacitor conductive layers 452 and 460 define the capacitor C2.

The via-hole conductor v16 passes through the insulating layer 16j in the top-bottom direction, and connects the front end of the linear conductive layer 448 and the capacitor conductive layer 452. The via-hole conductor v17 passes through the insulating layer 16j in the top-bottom direction, and connects the front end of the linear conductive layer 450 and the capacitor conductive layer 452. With this configuration, the inductor L2 and the capacitor C2 are electrically connected in series with each other. Since the capacitor conductive layer 460 is connected to the outer electrode 14c by using the via-hole conductors v51 through v54, the capacitor C2 is connected to the outer electrode 14c.

With the above-described configuration, the LC series resonator LC1 is located on the left side of the LC series resonator LC2, and the LC series resonator LC3 is located on the right side of the LC series resonator LC2.

The electronic component 10d configured as described above achieves the same advantages as those of the electronic component 10a.

In the electronic component 10d, each of the inductor conductive layers 442b and 442e includes two linear conductive layers electrically connected parallel with each other. Accordingly, the direct-current (DC) resistance of the inductor conductive layers 442b and 442e is reduced, and thus, the DC resistance of the inductor L2 is reduced. As a result, it is possible to reduce the insertion loss of the electronic component 10d. Each of the inductor conductive layers 442b and 442e may be constituted by three or more linear conductive layers electrically connected in parallel with each other.

In the electronic component 10d, since the linear conductive layer 444 is displaced from the inductor conductive layer 442d toward the left side, it is disposed close to the inductor L1. As a result, the electromagnetic coupling between the linear conductive layer 444 and the inductor L1 is intensified. Similarly, since the linear conductive layer 446 is displaced from the inductor conductive layer 442d toward the right side, it is disposed close to the inductor L3. As a result, the electromagnetic coupling between the linear conductive layer 446 and the inductor L3 is intensified. For the same reason, electromagnetic coupling between the linear conductive layer 448 and the inductor L1 and electromagnetic coupling between the linear conductive layer 450 and the inductor L3 are intensified. That is, the degrees of electromagnetic coupling between the inductors L1 and L2 and between the inductors L2 and L3 are increased.

The inductor conductive layer 442b includes the linear conductive layers 444 and 446. If the distance between the linear conductive layers 444 and 446 in the right-left direction is increased, the length of the current path of the inductor conductive layer 442b is increased. That is, the inductance value of the inductor L2 is increased. In this manner, by adjusting the distance between the linear conductive layers 444 and 446, it is possible to adjust the inductance value of the inductor L2. For the same reason, by adjusting the distance between the linear conductive layers 448 and 450, it is possible to adjust the inductance value of the inductor L2.

Other Preferred Embodiments

An electronic component according to a preferred embodiment of the present invention is not restricted to the electronic components 10a through 10d of the first through fourth preferred embodiments, and it may be modified within the spirit of the present invention.

The configurations of the electronic components 10a through 10d may be combined in a desired manner.

In the electronic components 10a through 10d of the first through fourth preferred embodiments, an inward inductor conductive layer and an outward inductor conductive layer adjacent to each other preferably are displaced from each other in the right-left direction. However, inductor conductive layers which are not adjacent to each other may be displaced from each other in the right-left direction. In the electronic component 10a, for example, the inductor conductive layer 30d may be displaced from the inductor conductive layer 30f toward the right side or the left side, as viewed from above, and the inductor conductive layers 30a through 30c, and 30e may be superposed on the inductor conductive layer 30f, as viewed from above. The via-hole conductors may also be modified in a similar manner.

Preferred embodiments of the present invention are suitably used as an electronic component since it is possible to significantly reduce or prevent the occurrence of parasitic capacitance in inductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body including a plurality of insulating layers stacked on each other in a stacking direction; and
a first resonator including a first inductor and a first capacitor disposed in the multilayer body; wherein
the first inductor is defined by a conductive layer disposed on an insulating layer of the plurality of insulating layers and an interlayer connecting conductor which passes through the insulating layer of the plurality of insulating layers in the stacking direction, the conductive layer and the interlayer connecting conductor are connected so that the first inductor has a helical or substantially helical shape as viewed from a first direction perpendicular or substantially perpendicular to the stacking direction;
a first portion of the first inductor is located on a predetermined plane perpendicular or substantially perpendicular to the first direction, and a second portion of the first inductor is displaced from the predetermined plane in the first direction;
the conductive layer includes a first conductive layer positioned inward and a second conductive layer positioned outward adjacent to each other as viewed from the stacking direction;
the first conductive layer includes first and second linear conductive layers connected to each other at one end of each of the first and second linear conductive layers;
at least a portion of the first linear conductive layer is displaced from the second conductive layer toward one side of the first direction; and
at least a portion of the second linear conductive layer is displaced from the second conductive layer toward another side of the first direction.

2. The electronic component according to claim 1, wherein
the interlayer connecting conductor includes a first interlayer connecting conductor positioned inward and a second interlayer connecting conductor positioned outward which are adjacent to each other; and
the first and second interlayer connecting conductors are displaced from each other in the first direction.

3. The electronic component according to claim 2, further comprising:
first and second input/output terminals and a ground terminal disposed on surfaces of the multilayer body; wherein
the first inductor and the first capacitor are connected in series with each other between the ground terminal and a signal path which connects the first and second input/output terminals so as to define an LC series resonator.

4. The electronic component according to claim 1, further comprising:
first and second input/output terminals and a ground terminal disposed on surfaces of the multilayer body; wherein
the first inductor and the first capacitor are connected in series with each other between the ground terminal and a signal path which connects the first and second input/output terminals so as to define an LC series resonator.

5. The electronic component according to claim 4, further comprising:
a second inductor disposed on the signal path; and
a second capacitor disposed between the signal path and the ground terminal; wherein
the second inductor and the second capacitor define a low pass filter.

6. The electronic component according to claim 5, wherein
a cutoff frequency of the low pass filter is higher than a resonant frequency of the LC series resonator; and
the low pass filter and the LC series resonator define a band pass filter.

7. The electronic component according to claim 4, further comprising:
a third capacitor disposed on the signal path; wherein
the first inductor and the third capacitor define a high pass filter.

8. The electronic component according to claim 1, wherein an entirety of the first conductive layer positioned inward is located farther rightward than the second conductive layer positioned outward, as viewed from above.

9. The electronic component according to claim 1, further comprising:

first and second input/output terminals and a ground terminal disposed on surfaces of the multilayer body; wherein the first inductor and the first capacitor are connected in parallel with each other between the ground terminal and a signal path which connects the first and second input/output terminals so as to define an LC parallel resonator.

10. The electronic component according to claim 1, further comprising:
a second resonator disposed on the one side of the first direction with respect to the first resonator; and
a third resonator disposed on the another side of the first direction with respect to the first resonator.

11. An electronic component comprising:
a multilayer body including a plurality of insulating layers stacked on each other in a stacking direction; and
a first resonator including a first inductor and a first capacitor disposed in the multilayer body; wherein
the first inductor is defined by a conductive layer disposed on an insulating layer of the plurality of insulating layers and an interlayer connecting conductor which passes through the insulating layer of the plurality of insulating layers in the stacking direction, the conductive layer and the interlayer connecting conductor are connected so that the first inductor has a helical or substantially helical shape as viewed from a first direction perpendicular or substantially perpendicular to the stacking direction;
a first portion of the first inductor is located on a predetermined plane perpendicular or substantially perpendicular to the first direction, and a second portion of the first inductor is displaced from the predetermined plane in the first direction;
the conductive layer includes a first conductive layer positioned inward and a second conductive layer positioned outward adjacent to each other as viewed from the stacking direction;
the second conductive layer includes first and second linear conductive layers connected to each other at one end of each of the first and second linear conductive layers;
at least a portion of the first linear conductive layer is displaced from the first conductive layer toward one side of the first direction; and
at least a portion of the second linear conductive layer is displaced from the first conductive layer toward another side of the first direction.

12. The electronic component according to claim 11, wherein
the interlayer connecting conductor includes a first interlayer connecting conductor positioned inward and a second interlayer connecting conductor positioned outward which are adjacent to each other; and
the first and second interlayer connecting conductors are displaced from each other in the first direction.

13. The electronic component according to claim 11, further comprising:
first and second input/output terminals and a ground terminal disposed on surfaces of the multilayer body; wherein
the first inductor and the first capacitor are connected in series with each other between the ground terminal and a signal path which connects the first and second input/output terminals so as to define an LC series resonator.

14. The electronic component according to claim 13, further comprising:
a second inductor disposed on the signal path; and
a second capacitor disposed between the signal path and the ground terminal; wherein the second inductor and the second capacitor define a low pass filter.

15. The electronic component according to claim 14, wherein
a cutoff frequency of the low pass filter is higher than a resonant frequency of the LC series resonator; and
the low pass filter and the LC series resonator define a band pass filter.

16. The electronic component according to claim 13, further comprising:
a third capacitor disposed on the signal path; wherein
the first inductor and the third capacitor define a high pass filter.

17. The electronic component according to claim 11, further comprising:
a second resonator disposed on the one side of the first direction with respect to the first resonator; and
a third resonator disposed on the another side of the first direction with respect to the first resonator.

18. The electronic component according to claim 11, wherein an entirety of the first conductive layer positioned inward is located farther rightward than the second conductive layer positioned outward, as viewed from above.

19. The electronic component according to claim 11, further comprising:
first and second input/output terminals and a ground terminal disposed on surfaces of the multilayer body; wherein
the first inductor and the first capacitor are connected in parallel with each other between the ground terminal and a signal path which connects the first and second input/output terminals so as to define an LC parallel resonator.

20. An electronic component comprising:
a multilayer body including a plurality of insulating layers stacked on each other in a stacking direction; and
a first resonator including a first inductor and a first capacitor disposed in the multilayer body; wherein
the first inductor is defined by a conductive layer disposed on an insulating layer of the plurality of insulating layers and an interlayer connecting conductor which passes through the insulating layer of the plurality of insulating layers in the stacking direction, the conductive layer and the interlayer connecting conductor are connected so that the first inductor has a helical or substantially helical shape as viewed from a first direction perpendicular or substantially perpendicular to the stacking direction;
a first portion of the first inductor is located on a predetermined plane perpendicular or substantially perpendicular to the first direction, and a second portion of the first inductor is displaced from the predetermined plane in the first direction;
the conductive layer includes a first conductive layer positioned inward and a second conductive layer positioned outward adjacent to each other as viewed from the stacking direction;
at least a portion of the first conductive layer is displaced from the second conductive layer in the first direction; and
two ends of the first conductive layer positioned inward are superposed on the second conductive layer positioned outward, as viewed from above, and portions of the first conductive layer other than the two ends thereof are located farther rightward than the second conductive layer, as viewed from above.

\* \* \* \* \*